US010651219B2

(12) United States Patent
Choi et al.

(10) Patent No.: US 10,651,219 B2
(45) Date of Patent: May 12, 2020

(54) IMAGE SENSOR

(71) Applicant: SAMSUNG ELECTRONICS CO., LTD., Suwon-si, Gyeonggi-do (KR)

(72) Inventors: Sung Soo Choi, Hwaseong-si (KR); Kyung Ho Lee, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/436,447

(22) Filed: Jun. 10, 2019

(65) Prior Publication Data

US 2019/0296072 A1    Sep. 26, 2019

Related U.S. Application Data

(63) Continuation of application No. 15/666,907, filed on Aug. 2, 2017, now Pat. No. 10,373,997.

(30) Foreign Application Priority Data

Feb. 1, 2017    (KR) .................. 10-2017-0014560

(51) Int. Cl.
| | | |
|---|---|---|
| *H01L 27/146* | (2006.01) | |
| *H01L 31/062* | (2012.01) | |
| *H01L 31/113* | (2006.01) | |
| *H01L 31/0203* | (2014.01) | |
| *H01L 31/0216* | (2014.01) | |
| *H01L 31/0232* | (2014.01) | |

(52) U.S. Cl.
CPC .. *H01L 27/14627* (2013.01); *H01L 27/14621* (2013.01); *H01L 27/14636* (2013.01); *H01L 27/14645* (2013.01); *H01L 27/14649* (2013.01); *H01L 31/0203* (2013.01); *H01L 31/02161* (2013.01); *H01L 31/02162* (2013.01); *H01L 31/02327* (2013.01); *H01L 31/062* (2013.01); *H01L 31/113* (2013.01); *H01L 2224/48* (2013.01)

(58) Field of Classification Search
CPC ......... H01L 27/14627; H01L 27/14621; H01L 27/14636; H01L 27/14645; H01L 27/14649; H01L 31/062; H01L 31/113; H01L 2224/48
See application file for complete search history.

(56) References Cited

U.S. PATENT DOCUMENTS

| | | |
|---|---|---|
| 8,445,950 B2 | 5/2013 | Iida et al. |
| 8,928,784 B2 | 1/2015 | Watanabe et al. |
| 9,153,612 B2 | 10/2015 | Miyanami |
| 9,349,770 B2 | 5/2016 | Lenchenkov |
| 9,425,227 B1 | 8/2016 | Wang |
| 9,443,899 B1 | 9/2016 | Liu et al. |
| 2006/0077268 A1* | 4/2006 | Yokozawa ........ H01L 27/14621 348/272 |
| 2010/0201834 A1 | 8/2010 | Maruyama et al. |

(Continued)

*Primary Examiner* — Fernando L Toledo
*Assistant Examiner* — Neil R Prasad
(74) *Attorney, Agent, or Firm* — Lee IP Law, P.C.

(57) ABSTRACT

An image sensor and a method for fabricating the same are provided, in which the image sensor includes a substrate including a first sensing region having a photoelectric device therein, a boundary isolation film partitioning the first sensing region, an inner reflection pattern film within the substrate in the sensing region, an infrared filter on the substrate, and a micro lens on the infrared filter.

19 Claims, 28 Drawing Sheets

(56) References Cited

U.S. PATENT DOCUMENTS

| | | | |
|---|---|---|---|
| 2011/0057279 A1* | 3/2011 | Lee | H01L 27/14609 257/432 |
| 2011/0066051 A1 | 3/2011 | Moon et al. | |
| 2012/0153128 A1 | 6/2012 | Roy et al. | |
| 2014/0054662 A1 | 2/2014 | Yanagita et al. | |
| 2015/0091121 A1 | 4/2015 | Manda et al. | |
| 2015/0311239 A1 | 10/2015 | Won et al. | |
| 2015/0323800 A1 | 11/2015 | Nam et al. | |
| 2016/0027837 A1 | 1/2016 | Webster et al. | |
| 2016/0099280 A1 | 4/2016 | Huang et al. | |
| 2016/0163760 A1 | 6/2016 | Tsai et al. | |
| 2016/0254304 A1 | 9/2016 | Chou et al. | |
| 2017/0104020 A1 | 4/2017 | Lee et al. | |
| 2017/0330905 A1* | 11/2017 | Tak | H01L 27/1462 |
| 2018/0158857 A1 | 6/2018 | Oshiyama et al. | |

* cited by examiner

IMAGE SENSOR

CROSS-REFERENCE TO RELATED APPLICATIONS

This is a continuation application based on pending application Ser. No. 15/666,907, filed Aug. 2, 2017, the entire contents of which is hereby incorporated by reference.

Korean Patent Application No. 10-2017-0014560 filed on Feb. 1, 2017 in the Korean Intellectual Property Office, and entitled: "Image Sensor and Method for Fabricating the Same," is incorporated by reference herein in its entirety.

BACKGROUND

1. Field

The present disclosure relates to an image sensor and a method for fabricating the same.

2. Description of the Related Art

An image sensor converts an optical image into an electric signal. A complementary metal oxide semiconductor (CMOS) image sensor (CIS) includes a plurality of 2-dimensionally arranged pixels. Each of the pixels includes a photodiode to convert an incident light into an electric signal.

In recent years, according to development in the computer and the communication industries, demand has increased for the image sensors with enhanced performances in a variety of fields such as digital cameras, camcorders, personal communication systems (PCS), gaming devices, security cameras, medical micro cameras, robots, and so on. Further, highly-integrated semiconductor devices have enabled high integration of image sensors.

SUMMARY

According to an embodiment, there is provided an image sensor, including a substrate having a first sensing region with a photoelectric device therein, a boundary isolation film to partition the first sensing region, an inner reflection pattern film within the substrate in the sensing region, an infrared filter on the substrate and a micro lens formed on the infrared filter.

According to another embodiment, there is provided an image sensor, including a substrate having first and second sensing regions, each having a photoelectric device therein, a boundary isolation film defining a boundary of the first and second sensing regions, an inner reflection pattern film formed within the substrate in the second sensing region, a first filter formed on the first sensing region of the substrate, a second filter formed on the second sensing region of the substrate, wherein the second filter is different from the first filter, a first micro lens formed on the first filter and a second micro lens formed on the second filter.

According to still another embodiment, there is provided an image sensor, including a substrate including first and second surfaces opposite each other and a first sensing region, and having a photoelectric device therein, an insulating structure on the first surface and including a wire structure, a boundary isolation film on the second surface into the substrate and defining the first sensing region, an inner reflection pattern film forming within the first sensing region into the substrate, and including a same material as the boundary isolation film, a filter on the second surface that transmits only light of a certain wavelength and a micro lens formed on the filter.

According to an embodiment, there is provided a method for fabricating an image sensor, including providing a substrate having first and second surfaces opposite each other, wherein the substrate includes a photoelectric device therein, forming an insulating structure including a wire structure on the first surface, forming a boundary isolation film defining a sensing region of the substrate, forming an inner reflection pattern film within the sensing region and forming a filter and a micro lens on the second surface.

According to an embodiment, there is provided an image sensor, including a substrate including infrared and color sensing regions each having a photoelectric device therein, a boundary isolation film defining a boundary of the infrared and color sensing regions, an inner reflection pattern film within the substrate in the infrared region, a color filter on the color sensing region of the substrate, and an infrared filter on the infrared sensing region of the substrate.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
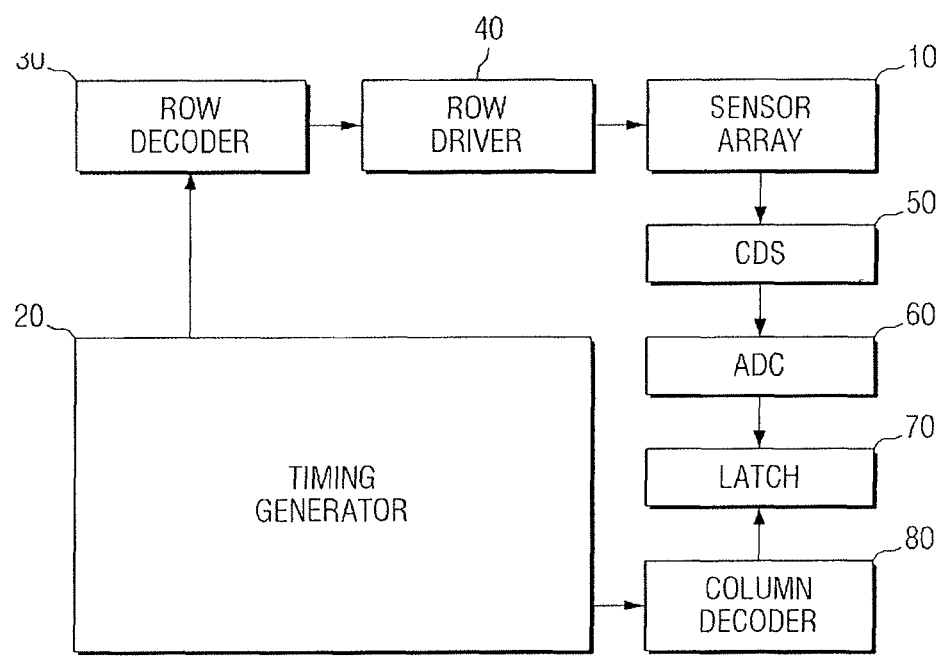
FIG. 1 illustrates a block diagram of an image sensor according to some exemplary embodiments.
Figure 2:
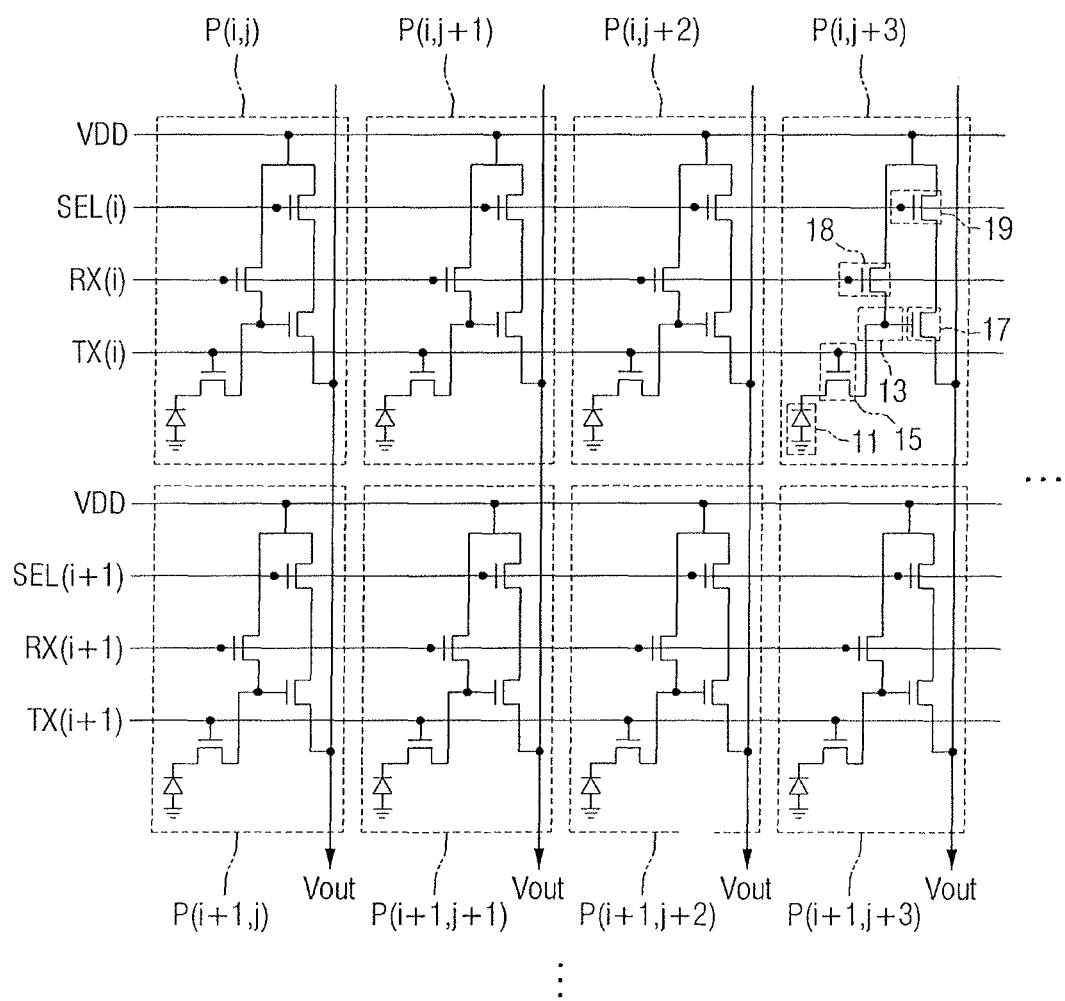
FIG. 2 illustrates an equivalent circuit diagram of the sensor array of FIG. 1.
Figure 3:
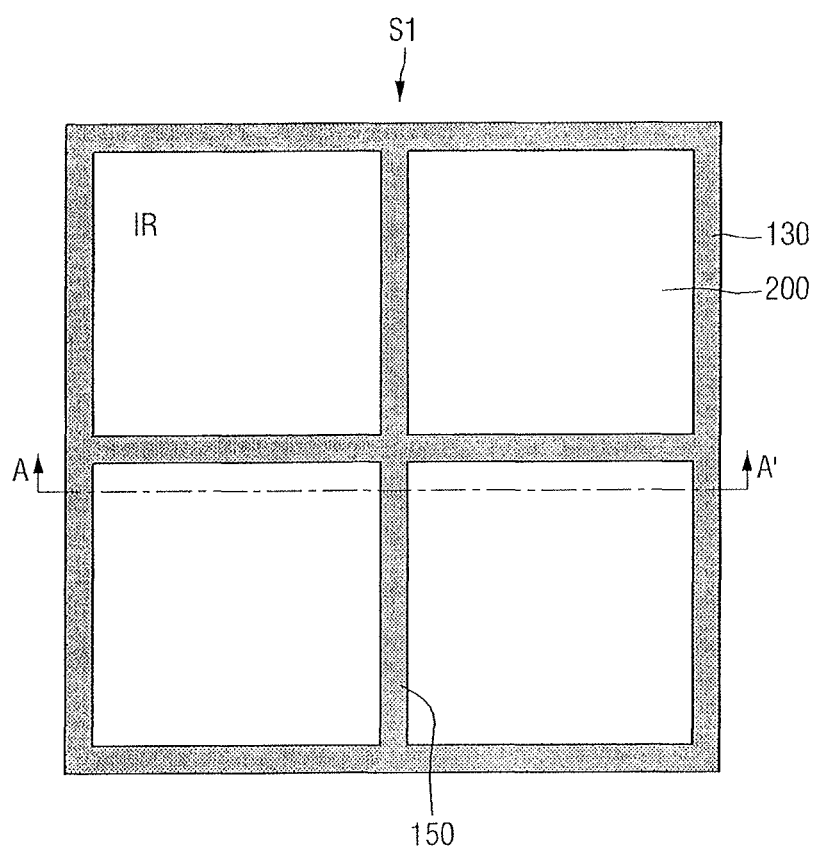
FIG. 3 illustrates a layout diagram provided to explain an image sensor according to some exemplary embodiments.
Figure 4:
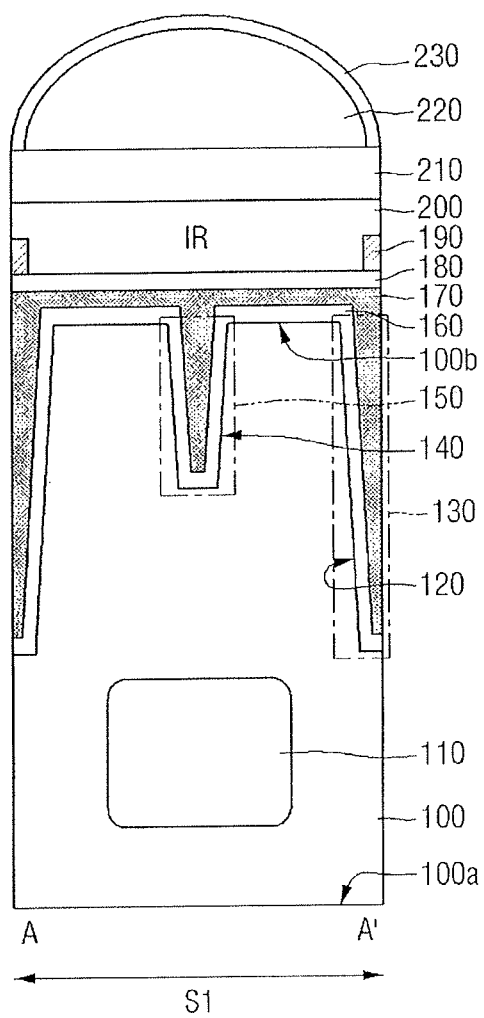
FIG. 4 illustrates a cross-sectional view taken on line A-A' of FIG. 3.
Figure 5:
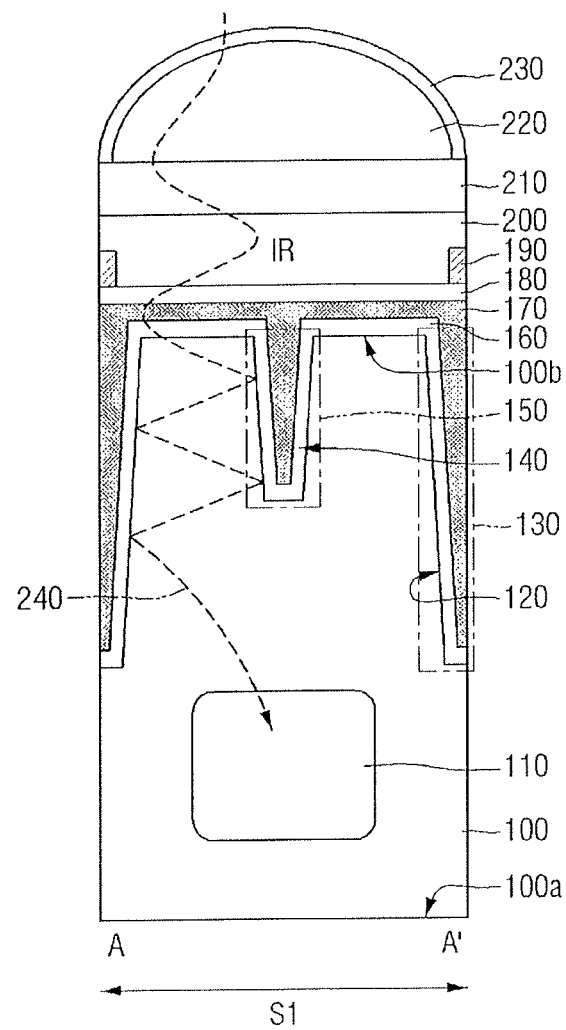
FIG. 5 illustrates a concept view provided to explain operation when infrared light is incident on the sensor shown in FIG. 4.

Hereinafter, an image sensor according to some exemplary embodiments will be described with reference to FIGS. 1 to 5. FIG. 1 is a block diagram provided to explain an image sensor according to some exemplary embodiments, and FIG. 2 is an equivalent circuit diagram of the sensor array in FIG. 1. FIG. 3 is a layout diagram provided to explain an image sensor according to some exemplary embodiments, and FIG. 4 is a cross-sectional view taken on line A-A' of FIG. 3. FIG. 5 is a concept view provided to explain operation when infrared light is incident on the sensor shown in FIG. 4.

Referring to FIG. 1, an image sensor according to some exemplary embodiments includes a sensor array 10, a timing generator 20, a row decoder 30, a row driver 40, a correlated double sampler (CDS) 50, an analog to digital converter (ADC) 60, a latch 70, a column decoder 80, and so on.

The sensor array 10 includes a plurality of 2-dimensionally arranged unit pixels. The plurality of unit pixels converts an optical image into an electric output signal. The sensor array 10 receives a plurality of driving signals including row-select signal, reset signal, charge transfer signal, and so on, and is driven accordingly. Further, the converted electric output signal is provided to the correlated double sampler 50 through vertical signal lines.

The timing generator 20 provides a timing signal and a control signal to the row decoder 30 and the column decoder 80.

The row driver 40 provides the sensor array 10 with a plurality of driving signals to drive a plurality of unit pixels according to a result of decoding at the row decoder 30. Generally, the driving signals are provided to each of the rows when the unit pixels are arranged in a matrix form.

The correlated double sampler 50 receives an output signal from the sensor array 10 through a vertical signal line, and holds and samples the received signal. That is, the correlated double sampler 50 double-samples a certain noise level and a signal level according to the output signal, and outputs a difference level corresponding to a difference between the noise level and the signal level.

The analog to digital converter 60 converts an analog signal corresponding to the difference level into a digital signal, and outputs the result of conversion.

The latch 70 latches the digital signal, and the latched signal is output to an image signal processor sequentially according to the result of decoding at the column decoder 80.

Referring to FIG. 2, pixels P are arranged into a matrix pattern to construct the sensor array 10. Each of the pixels P includes a photoelectric transistor 11, a floating diffusion region 13, a charge transfer transistor 15, a drive transistor 17, a reset transistor 18, and a select transistor 19. These functions will be described with reference to i-th row pixel (P(i, j), P(i, j+1), P(i, j+2), P(i, j+3), . . . ) as an example.

The photoelectric transistor 11 absorbs the incident light and accumulates charges corresponding to a quantity of the light. For the photoelectric transistor 11, a photodiode, a phototransistor, a photogate, a pinned photodiode or a combination thereof may be applied, although the photodiode is illustrated in the drawings as an example.

Each of the photoelectric transistors 11 is coupled with each of the charge transfer transistors 15 that transfer the accumulated charges to the floating diffusion region 13. The floating diffusion region 13 is a region where the charges are converted into voltages, and because of the parasitic capacitance, the charges are accumulatively stored.

The drive transistor 17, exemplified herein as a source follower amplifier, amplifies a change in the electric potential of the floating diffusion region 13 transmitted with the accumulated charges of each of the photoelectric transistors 11, and outputs the amplified result to an output line Vout.

The reset transistor 18 periodically resets the floating diffusion region 13. The reset transistor 18 may be composed of one MOS transistor that is driven by the bias provided from a reset line RX(i) for applying a predetermined bias (i.e., reset signal). When the reset transistor 18 is turned on by the bias provided from the reset line RX(i), a predetermined electric potential provided at a drain of the reset transistor 18, e.g., a power voltage VDD, is transmitted to the floating diffusion region FD.

The select transistor 19 selects a pixel P to be read in a row unit. The select transistor 19 may be composed of one MOS transistor that is driven by the bias (i.e., row select signal) provided from a row select line SEL(i). When the select transistor 19 is turned on by the bias provided from the row select line SEL(i), a predetermined electric potential provided at a drain of the select transistor 19, e.g., the power voltage VDD, is transmitted to the drain region of the drive transistor 17.

The transfer line TX(i) to apply the bias to the charge transfer transistor 15, the reset line RX(i) to apply the bias to the reset transistor 18, and the row select line SEL(i) to apply the bias to the select transistor 19 may be arranged in a substantially parallel extension with each other in a row direction.

FIGS. 3 and 4 illustrate a structure around the photoelectric transistor 11 of FIG. 2. The photoelectric transistor 11 of FIG. 2 may correspond to a first photoelectric device 110 of FIG. 4.

Referring to FIGS. 3 and 4, the image sensor according to some exemplary embodiments includes a substrate 100, a first photoelectric device 110, a boundary isolation film 130, an inner reflection pattern film 150, a first fixed charge film 160, a first anti-reflection film 170, a first lower planarizing film 180, a first side anti-reflection film 190, an infrared filter 200, a first upper planarizing film 210, a first micro lens 220, and a first protection film 230.

The substrate 100 may include a first surface 100a and a second surface 100b opposite each other. The first surface 100a of the substrate 100 may be a front surface of the substrate 100, e.g., a bottom surface furthest from where light is incident on the image sensor, and the second surface 100b of the substrate may be a back side of the substrate 100, e.g., a top surface closest to where light is incident on the mage sensor. However, exemplary embodiments are not limited to the example given above.

For example, the substrate 100 may use a P-type or an N-type bulk substrate, or may use a P-type or an N-type epitaxial layer grown on the P-type bulk substrate, or may use a P-type or an N-type epitaxial layer grown on the N-type bulk substrate. Further, a substrate other than a semiconductor substrate, such as an organic plastic substrate and so on, may also be used for the substrate 100.

A first sensing region S1 may be formed within the substrate 100. Specifically, the first sensing region S1 may be a region where the incident infrared light is sensed with the infrared filter 200. The first sensing region S1 may be defined by the boundary isolation film 130 which will be explained below.

The first photoelectric device 110, e.g., a photodiode, is formed within the substrate 100 of the first sensing region S1. The first photoelectric device 110 may be formed near the first surface 100a of the substrate 100, although exemplary embodiments are not limited to any specific example only. The first photoelectric device 110 may be the phototransistor 11 of FIG. 2, i.e., the photodiode, the phototransistor, the photogate, the pinned-type photodiode or a combination thereof.

The boundary isolation film 130 may be formed within the substrate 100. The boundary isolation film 130 may define the first sensing region S1 within the substrate 100. The boundary isolation film 130 may be formed on an edge of the first sensing region S1. Due to the presence of the boundary isolation film 130, the first sensing region S1 may be defined to be a closed space. A plane cross-sectional shape of the boundary isolation film 130 may be a closed curved line in a loop shape.

The boundary isolation film 130 may be formed within a boundary isolation trench 120. The boundary isolation trench 120 may be formed by etching in a depth direction into the substrate 100. The boundary isolation trench 120 may be formed in the second surface 100b of the substrate 100, and may extend in direction toward the first surface 100a. The boundary isolation trench 120 may not reach the first surface 100a of the substrate 100.

In an example, a depth of the boundary isolation trench 120 may be less than a depth at which the first photoelectric device 110 is positioned, e.g., a bottom surface of the boundary isolation trench 120 may be further from the first surface 100a than a top surface of the first photoelectric device 110. This is to prevent damage to the first photoelectric device during formation of the boundary isolation trench 120. However, exemplary embodiments are not limited to the example given above.

In the image sensor according to some embodiments, a depth of the boundary isolation trench 120 may become deeper than a depth at which the first photoelectric device 110 is positioned, when the boundary isolation trench 120 is formed at a sufficient horizontal distance away from the first photoelectric device 110.

A side or lateral surface of the boundary isolation trench 120 may have a tapered shape, as illustrated in FIG. 4. Specifically, a width of the boundary isolation trench 120 may gradually decrease in a downward direction, e.g., towards the first surface 100a, and may gradually increase in an upward direction, e.g., towards the second surface 100b. However, exemplary embodiments are not limited to the example given above.

As illustrated in drawings, the boundary isolation trench 120 may be filled with the fixed charge film 160 and the first anti-reflection film 170 formed on the fixed charge film 160, to form the boundary isolation film 130, which will be described below. Alternatively, the boundary isolation trench 120 may be filled with one material.

As shown in FIG. 4, the boundary isolation film 130 may include the fixed charge film 160 and the first anti-reflection film 170. For example, the boundary isolation film 130 may include at least one of silicon oxide, silicon nitride, silicon oxynitride, or a low-k dielectric material with a smaller dielectric constant than silicon oxide. For example, the low-k dielectric material may include flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, or a combination thereof, but not limited thereto.

An inner reflection pattern trench 140 may be formed by etching in a depth direction into the substrate 100. The inner reflection pattern trench 140 may be formed in the second surface 100b of the substrate 100, and may extend in a direction toward the first surface 100a. The inner reflection pattern trench 140 may not reach the second surface 100b of the substrate 100.

In an example, a depth of the inner reflection pattern trench 140 may be less than a depth at which the first photoelectric device 110 is positioned. Thus, damage to the first photoelectric device 110 during formation of the inner reflection pattern trench 140 may be prevented.

A depth of the inner reflection pattern trench 140 may be shallower than the boundary isolation trench 120, e.g., a bottom surface of the inner reflection pattern trench 140 trench may be further from the first surface 100a than a bottom surface of the boundary isolation trench 120. However, exemplary embodiments are not limited to the example given above. A depth of the inner reflection pattern trench 140 may be same as, or deeper than, the boundary isolation trench 120.

When a depth of the boundary isolation trench 120 increases so as to nearly approach a depth of the first photoelectric device 110, and when a depth of the inner reflection pattern trench 140 is same as a depth of the boundary isolation trench 120, the first photoelectric device 110 may be exposed to damage. Accordingly, in an example, a depth of the inner reflection pattern trench 140 may be shallower than a depth of the boundary isolation trench 120.

In the image sensor according to some exemplary embodiments, when a depth of the boundary isolation trench 120 does not approach the first photoelectric device 110, a depth of the inner reflection pattern trench 140 may be the same level as the boundary isolation trench 120. Because the method enables simultaneous formation of the boundary isolation trench 120 and the inner reflection pattern trench 140 with one etch process, fabricating cost of the image sensor according to some exemplary embodiments may be minimized and waste of the process may also be saved. Further, yield rate of the image sensor may be enhanced as difficulty of the process is decreased.

The inner reflection pattern film 150 may entirely fill the inner reflection pattern trench 140. Accordingly, when the inner reflection pattern film 150 and the boundary isolation film 130 are not connected, e.g., upper surfaces of the fixed charge film 160 and the first anti-reflection film 170 do not extend over the second surface 100b, the inner reflection pattern film 150 may be the same level as the second surface 100b of the substrate 100. The same may apply to the boundary isolation film 130. That is, an upper surface of the boundary isolation film 130, the second surface 100b of the substrate 100, and an upper surface of the inner reflection pattern film 150 may be flush with one another.

The inner reflection pattern film 150 may be formed within the first sensing region S1, e.g., may overlap the first sensing region in the vertical direction, e.g., a light incident direction. The inner reflection pattern film 150 may be aligned with a center of the first sensing region S1. The inner reflection pattern film 150 may partition the first sensing region S1 into a plurality of regions. The inner reflection pattern film 150 may be in contact with the boundary isolation film 130. Accordingly, the inner reflection pattern film 150 and the boundary isolation film 130 may be connected to each other, thus isolating a plurality of regions in a horizontal cross section.

Unlike the illustration, the inner reflection pattern film 150 and the boundary isolation film 130 may not be in contact with each other in the image sensor according to some exemplary embodiments. That is, the inner reflection pattern film 150 may have a shape such that the inner reflection pattern film 150 is surrounded with the boundary isolation film 130 defining the first sensing region S1 on the horizontal cross section, but not in contact with each other.

The inner reflection pattern film 150 may be filled with the fixed charge film 160 and the first anti-reflection film 170, like the boundary isolation film 130. However, exemplary embodiments are not limited to the example given above. The inner reflection pattern film 150 may be filled with one material. In this case, the fixed charge film 160 and the first anti-reflection film 170 may be formed on the inner reflection pattern film 150.

For example, the inner reflection pattern film 150 may include, for example, at least one of silicon oxide, silicon nitride, silicon oxynitride, or a low-k dielectric material with a smaller dielectric constant than silicon oxide.

The first fixed charge film 160 may be formed on the second surface 100b of the substrate 100, a surface (lateral surfaces and bottom surface) of the boundary isolation trench 120, and a surface (lateral surfaces and bottom surface) of the inner reflection pattern trench 140. The first fixed charge film 160 may be formed on an entire surface or a portion of the second surface 100b of the substrate 100.

The first fixed charge film 160 may be formed to be a P+ type, when the first photoelectric device 110 (e.g., the photodiode 11) formed on a pixel region is an N type. That is, the first fixed charge film 160 may reduce dark current by reducing electron-hole pair (EHP) generated thermally in the second surface 100b of the substrate 100. According to cases, the first fixed charge film 160 may be omitted.

The first fixed charge film 160 may include, e.g., a metal oxide film or a metal nitride film, in which the metal may include hafnium (Hf), aluminum (Al), zirconium (Zr), tantalum (Ta), and titanium (Ti). Further, the first fixed charge film 160 may include at least one of lanthanum (La), praseodymium (Pr), cerium (Ce), neodymium (Nd), promethium (Pm), samarium (Sm), europium (Eu), gadolinium (Gd), terbium (Tb), dysprosium (Dy), holmium (Ho), thulium (Tm), ytterbium (Yb), lutetium (Lu), and yttrium (Y). Further, the first fixed charge film 160 may be formed of a hafnium oxynitride film or an aluminum oxynitride film.

The first fixed charge film 160 is illustrated as a single-layered film in the drawing. However, it may be a stack structure combining two or more films formed of a same material or different materials from each other.

The first anti-reflection film 170 may be formed on the first fixed charge film 160. The first anti-reflection film 170 may entirely fill the boundary isolation trench 120 and the inner reflection pattern trench 140. The first anti-reflection film 170 may reduce or prevent reflection of the external incident light. The first anti-reflection film 170 may include a material having a different refractive index from the first fixed charge film 160. For example, the first anti-reflection film 170 may be formed of an insulating film such as a silicon oxide film, a silicon nitride film, a silicon oxynitride film, resin, a combination thereof, or a stack thereof.

Double-layered configuration of the first fixed charge film 160 and the first anti-reflection film 170 with different refractive indexes from each other may serve to prevent reflection. Accordingly, reflection of the incident light on the second surface 100b of the substrate 100 may be reduced or prevented.

The material/thickness of the first anti-reflection film 170 may be varied according to a wavelength of the light used in photo process. For example, a silicon oxide film with a thickness from about 50 Å to about 200 Å and a silicon nitride film with a thickness from about 300 Å to about 500 Å may be stacked and used as the first anti-reflection film 170. However, exemplary embodiments are not limited to the example given above.

The first lower planarizing film 180 may be formed on the first anti-reflection film 170. For example, the first lower planarizing film 180 may include at least one of a silicon oxide film-based material, a silicon nitride film-based material, resin or a combination thereof.

The first lower planarizing film 180 may be used as a buffer film to prevent damage of the substrate 100 in a patterning process for forming a pad (not illustrated) in the non-pixel region.

The first lower planarizing film 180 may include a silicon oxide film-based material, a silicon nitride film-based material, a resin, or a combination thereof. For example, a silicon oxide film with a thickness from about 3,000 Å to about 8,000 Å may be used as the first lower planarizing film 180. However, exemplary embodiments are not limited to the example given above.

The infrared filter 200 may be formed on the first lower planarizing film 180. The infrared filter 200 may filter out wavelengths others than the infrared light among the incident light. Accordingly, the light that passes through the infrared filter 200 is infrared light. The light passing through the infrared filter 200 may pass through the structures below and reach the first photoelectric device 110. The first photoelectric device 110 may generate electric current with the incident light.

The first side anti-reflection film 190 may be formed on the first lower planarizing film 180. The first side anti-reflection film 190 may overlie a portion of the first lower planarizing film 180. The first side anti-reflection film 190 may overlap the boundary isolation film 130 in a vertical direction. That is, the first side anti-reflection film 190 may be on an edge of the first sensing region S1.

The first side anti-reflection film 190 may be disposed on a side surface of the infrared filter 200. Specifically, the infrared filter 200 may overlie a side surface and an upper surface of the first side anti-reflection film 190. That is, a height of an upper surface of the first side anti-reflection film 190 may be lower than a height of an upper surface of the infrared filter 200.

The first side anti-reflection film 190 may reduce or prevent reflection or scattering of the incident light to the side surface when passing through the infrared filter 200. That is, the first side anti-reflection film 190 may prevent photons reflected and scattered from an interface of the infrared filter 200 and the first lower planarizing film 180 from moving to another sensing region. Because the first side anti-reflection film 190 operates at the interface as descried above, the first side anti-reflection film 190 may cover only a portion of the side surface of the infrared filter 200.

The first side anti-reflection film 190 may include a metal. The first side anti-reflection film 190 may include at least one of tungsten (W), aluminum (Al) and copper (Cu), for example.

The first upper planarizing film 210 may be formed flat on the infrared filter 200. For example, the first upper planarizing film 210 may include at least one of a silicon oxide film-based material, a silicon nitride film-based material, resin or a combination thereof. Although the first upper planarizing film 210 is illustrated as a single-layered film, this is provided only for convenience of explanation and the present disclosure is not limited hereto.

Although FIG. 4 illustrates by way of example that the first upper planarizing film 210 and the first lower planarizing film 180 are on an upper surface and a lower surface of the infrared filter 200, respectively, exemplary embodiments may not be limited hereto. For example, the planarizing film may be only on a lower surface of the infrared filter 200 or only on an upper surface of the infrared filter 200. Alternatively, the planarizing film may be absent on both of the upper surface and the lower surface of the infrared filter 200.

The first micro lens 220 may be formed on the first upper planarizing film 210. The first micro lens 220 may have a convex upward shape, as illustrated. The convex shape of the first micro lens 220 may concentrate the incident light to the first sensing region S1.

The first micro lens 220 may be formed of an organic material such as photoresist PR. However, exemplary embodiments are not limited to the examples provided above. Accordingly, the first micro lens 220 may be formed by using an inorganic material. Formation of the first micro lens 220 with an organic material may involve, for example, formation of the first micro lens 220 by forming an organic material pattern on the first upper planarizing film 210 and performing annealing process. The annealing process may cause the organic material pattern to be changed into a shape of the first micro lens 220.

The first protection film 230 may be formed with a certain thickness along a surface of the first micro lens 220. The first protection film 230 may be an inorganic oxide film. For example, a Silicon oxide ($SiO_2$) film, a titanium oxide ($TiO_2$) film, oxide ($ZrO_2$) film, a hafnium oxide ($HfO_2$) film, a stack thereof, and a combination thereof may be used. Specifically, for the first protection film 230, low temperature oxide (LTO), which is one type of the silicon oxide film, may be used. With utilization of the LTO, damage on the underlying films may be reduced because the LTO is fabricated at low temperature (about 100° C.-200° C.). Further, the LTO is amorphous and thus has a smooth surface, which may minimize reflection/refraction/scattering of the incident light.

Being formed of organic material, the first micro lens 220 may be vulnerable to external impact. Accordingly, the first protection film 230 may protect the first micro lens 220 from external impact. Further, there may be a certain space between the neighboring micro lenses, and the first protection film 230 may fill such space.

By filling the space between the neighboring micro lens and the first micro lens 220, the incident light concentrating capability may be increased. Filling the space as described above may reduce reflection/refraction/scattering of the incident light arriving at the space between the neighboring micro lens and the first micro lens 220.

Referring to FIG. 5, the image sensor according to some exemplary embodiments may convert the infrared light into electric current with the infrared filter 200. In principle, the infrared light has a longer wavelength than visible light and, accordingly, has a longer penetrating depth into silicon. Accordingly, a length of a substrate of the image sensor using other RGB filters may be significantly shorter with respect to the infrared filter. Accordingly, the quantum efficiency (QE) of the first sensing region S1 according to the infrared filter may be decreased. If the length of the substrate 100 is increased in order to prevent such QE loss, the sensing region for sensing the visible light having other short wavelengths may have increased blooming risk.

Accordingly, in an image sensor according to some exemplary embodiments, the length of the substrate 100 used with the infrared sensor is the same as that for use with visible light, e.g., RGB filter, and the incident infrared light 240 is reflected against the boundary isolation film 130 and the inner reflection pattern film 150 so as to be concentrated on the first photoelectric device 110. That is, the inner reflection pattern film 150 may effectively shorten silicon penetration depth only in the first sensing region S1 where the infrared filter 200 is positioned, differently from the other sensing regions.

Hereinbelow, an image sensor according to some exemplary embodiments will be described with reference to FIG. 6. In the following description, description that overlaps the exemplary embodiments already provided above will not be described or described as brief as possible for the sake of brevity.

Figure 6:
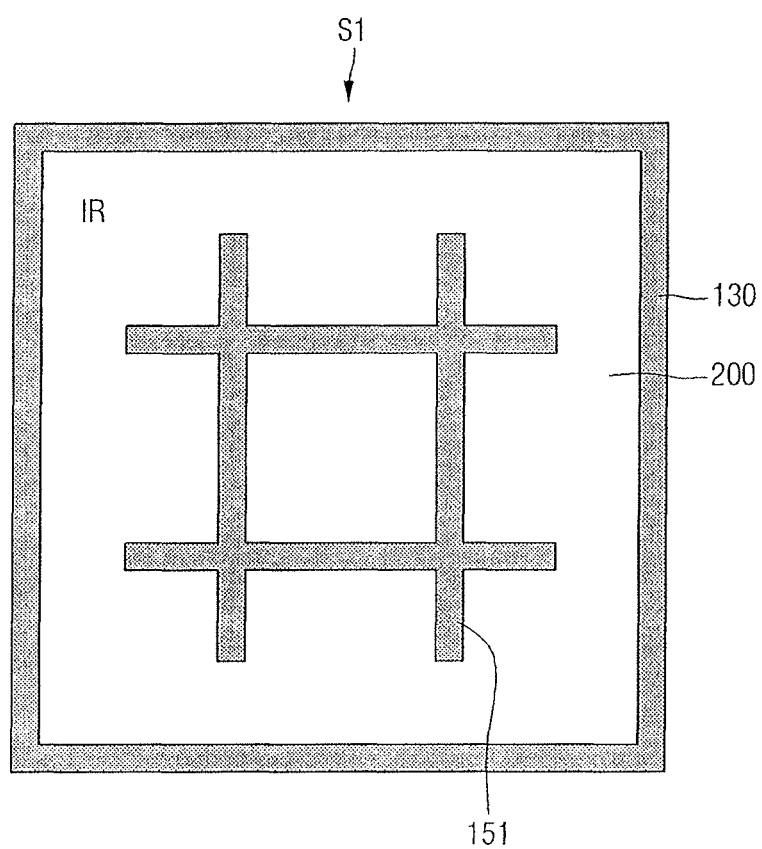
FIG. 6 illustrates a layout diagram provided to explain an image sensor according to some exemplary embodiments.

FIG. 6 is a layout diagram provided to explain an image sensor according to some exemplary embodiments. Referring to FIG. 6, the image sensor according to some exemplary embodiments may include an inner reflection pattern film 151.

The inner reflection pattern film 151 may have a plane shape which is not in contact with the boundary isolation film 130. The inner reflection pattern film 151 may isolate the first sensing region S1 into a rectangle region defined with the inner reflection pattern film 151 and a surrounding region thereof. As a result, when the incident infrared light entering into the two regions are reflected against the inner reflection pattern films 151 or the inner reflection pattern film 151 and the boundary isolation film 130, an effect of shortened effective silicon penetration depth may be obtained. Specifically, due to a small crisscross-shaped pattern formed on an edge of the rectangle, reflection from the neighboring spaces may be further strengthened and QE damage may be significantly reduced.

Hereinbelow, an image sensor according to some exemplary embodiments will be described with reference to FIG. 7. In the following description, description that overlap the exemplary embodiments already provided above will not be described or described as brief as possible for the sake of brevity.

Figure 7:
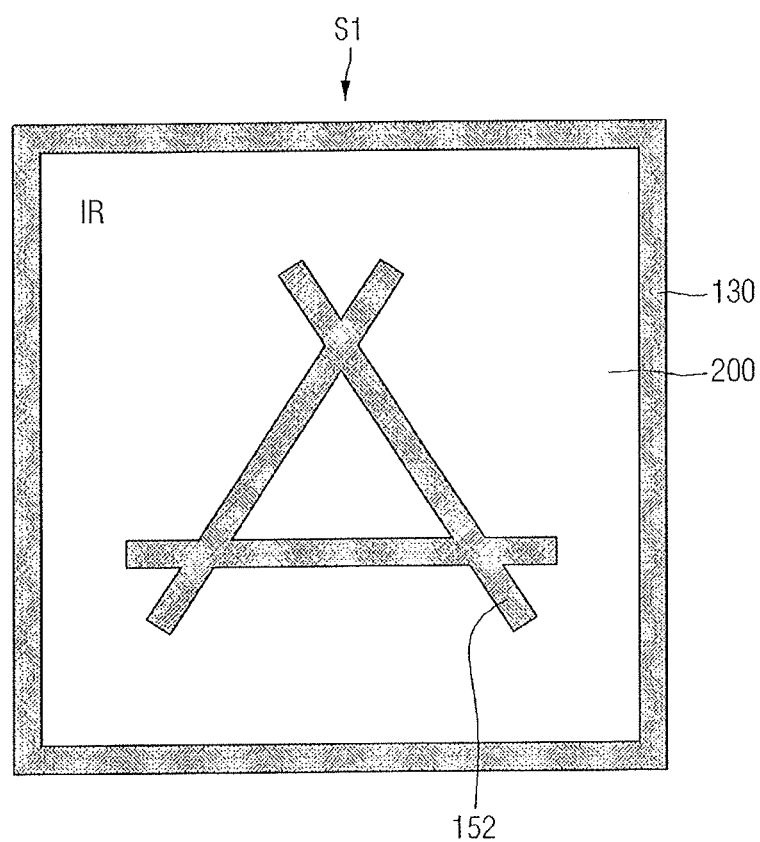
FIG. 7 illustrates a layout diagram provided to explain an image sensor according to some exemplary embodiments.

FIG. 7 is a layout diagram provided to explain an image sensor according to some exemplary embodiments. Referring to FIG. 7, the image sensor according to some exemplary embodiments may include an inner reflection pattern film 152.

The inner reflection pattern film 152 may have a plane shape which is not in contact with the boundary isolation film 130. The inner reflection pattern film 152 may isolate the first sensing region S1 into a triangle region defined with the inner reflection pattern film 152 and a surrounding region thereof. As a result, as the incident infrared light entering into the two regions are reflected against the inner reflection pattern films 152 or the inner reflection pattern film 152 and the boundary isolation film 130, an effect of a shortened effective silicon penetration depth may be obtained. Specifically, due to a small crisscross-shaped pattern formed on an edge of the triangle, reflection from the peripheral spaces may be further strengthened and QE damage may be significantly reduced.

Hereinbelow, an image sensor according to some exemplary embodiments will be described with reference to FIG. 8. In the following description, description that overlaps the exemplary embodiments already provided above will not be described or described as brief as possible for the sake of brevity.

Figure 8:
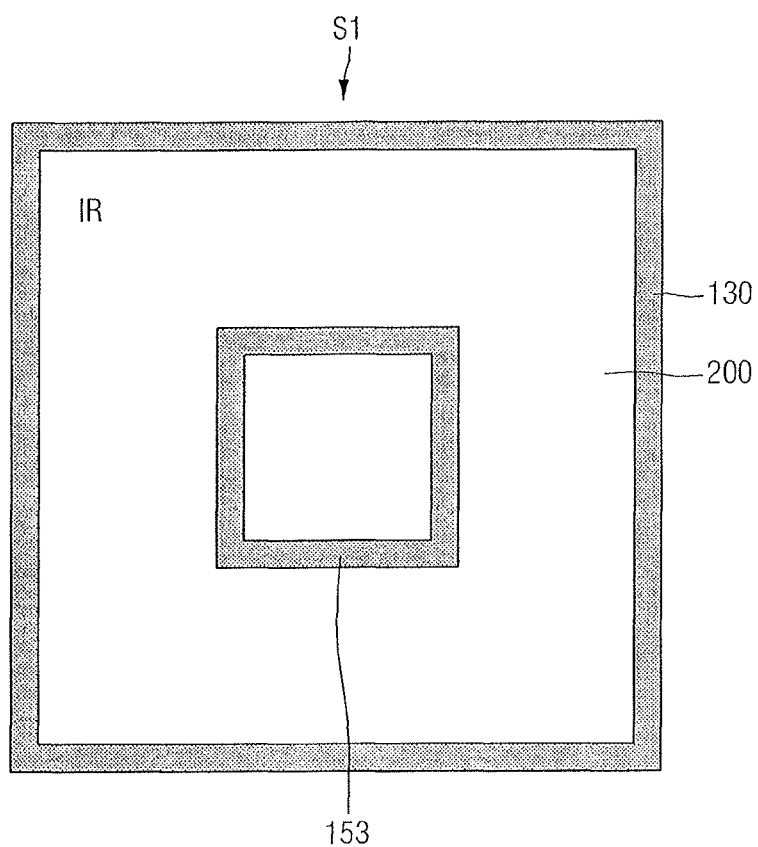
FIG. 8 illustrates a layout diagram provided to explain an image sensor according to some exemplary embodiments.

FIG. 8 is a layout diagram provided to explain an image sensor according to some exemplary embodiments. Referring to FIG. 8, the image sensor according to some exemplary embodiments may include an inner reflection pattern film 153.

The inner reflection pattern film 153 may have a plane shape which is not in contact with the boundary isolation film 130. The inner reflection pattern film 153 may isolate the first sensing region S1 into a rectangle region defined with the inner reflection pattern film 153 and a surrounding region thereof. As a result, as the incident infrared light entering into the two regions are reflected against the inner reflection pattern films 153 or the inner reflection pattern film 153 and the boundary isolation film 130, an effect of a shortened effective silicon penetration depth may be obtained. Specifically, because an edge of the rectangle is not formed with another pattern, the area where the incident light of the sensing region penetrates is increased and image sensing efficiency may thus be enhanced.

A shape of the inner reflection pattern film 150 may be freely modified according to purpose and characteristics of the image sensor, as exemplified in the above embodiments of FIGS. 6 to 8.

Hereinbelow, an image sensor according to some exemplary embodiments will be described with reference to FIG. 9. In the following description, description that overlaps the exemplary embodiments already provided above will not be described or described as brief as possible for the sake of brevity.

Figure 9:
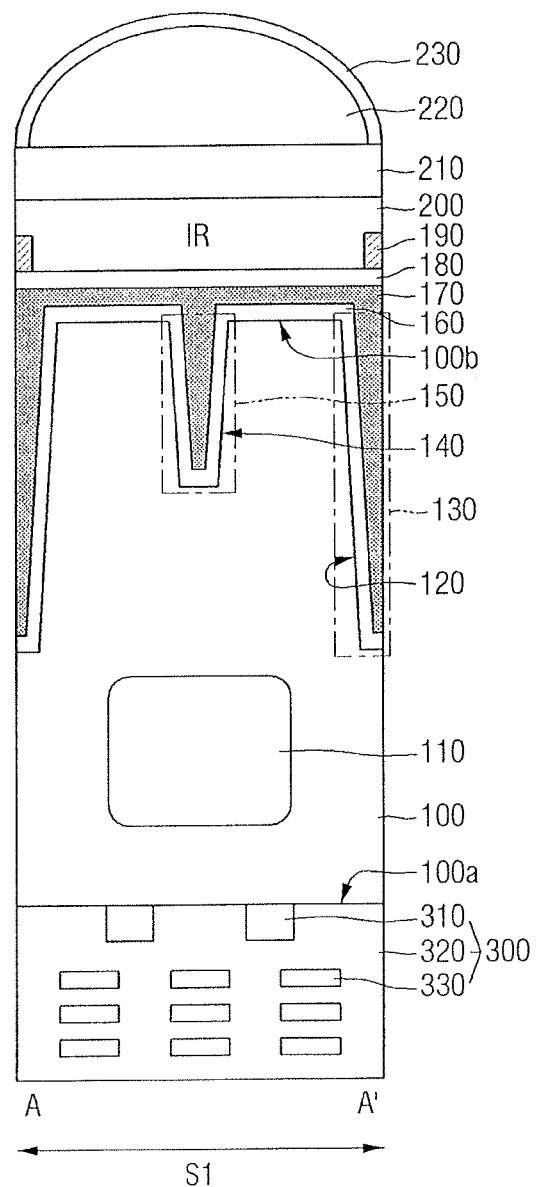
FIG. 9 illustrates a cross-sectional view provided to explain an image sensor according to some exemplary embodiments.

FIG. 9 is a cross-sectional view provided to explain an image sensor according to some exemplary embodiments. Referring to FIG. 9, the image sensor according to some exemplary embodiments may additionally include an insulating structure 300.

The insulating structure 300 may be formed on the first surface 100*a* of the substrate 100. That is, the insulating structure 300 may be formed on a front side of the substrate 100. The insulating structure 300 may include an insulating film 320, a gate structure 310, and a wire structure 330.

For example, the insulating film 320 may include at least one of a silicon oxide film, a silicon nitride film, a silicon oxynitride film, a low-k dielectric material, and a combination thereof. The insulating film 320 may overlie and surround the gate structure 310 and the wire structure 330 which will be described below. That is, the insulating film 320 may serve to insulate the gate structure 310 and the wire structure 330 from each other.

The insulating structure 310 may be on the first surface 100*a* of the substrate 100. As illustrated in FIG. 2, the gate structure 310 may be, for example, a gate of the charge transfer transistor 15, a gate of the reset transistor 18, a gate of the select transistor 19, a gate of the drive transistor 17, and so on.

Although FIG. 9 illustrates that the gate structure 310 is formed on the first surface 100*a* of the substrate 100, exemplary embodiments are not limited to any specific example only. Accordingly, the gate structure 310 may be a shape recessed or buried within the substrate 100 as well.

For example, the wire structure 330 may include aluminum (Al), copper (Cu), tungsten (W), cobalt (Co), ruthenium (Ru), and so on, but not limited hereto.

The wire structure 330 may be formed in the first region S1 and include a plurality of sequentially stacked wires. Although FIG. 9 illustrates the wire structure 330 with three sequentially-stacked layers, this is provided only for convenience of explanation, and the exemplary embodiments are not limited to any specific example only.

When the wire structure 330 is on the first surface 100*a* of the substrate 100, an area where the incident light is penetrated into the second surface 100*b* may be increased. Further, when the wire structure 330 is positioned on the first surface 100*a* of the substrate 100, the incident light is reflected against the wire structure 330 and directed back to the first photoelectric device 110. Accordingly, efficiency of the image sensor may be maximized.

Hereinbelow, an image sensor according to some exemplary embodiments will be described with reference to FIG. 10. In the following description, description that overlaps the exemplary embodiments already provided above will not be described or described as brief as possible for the sake of brevity.

Figure 10:
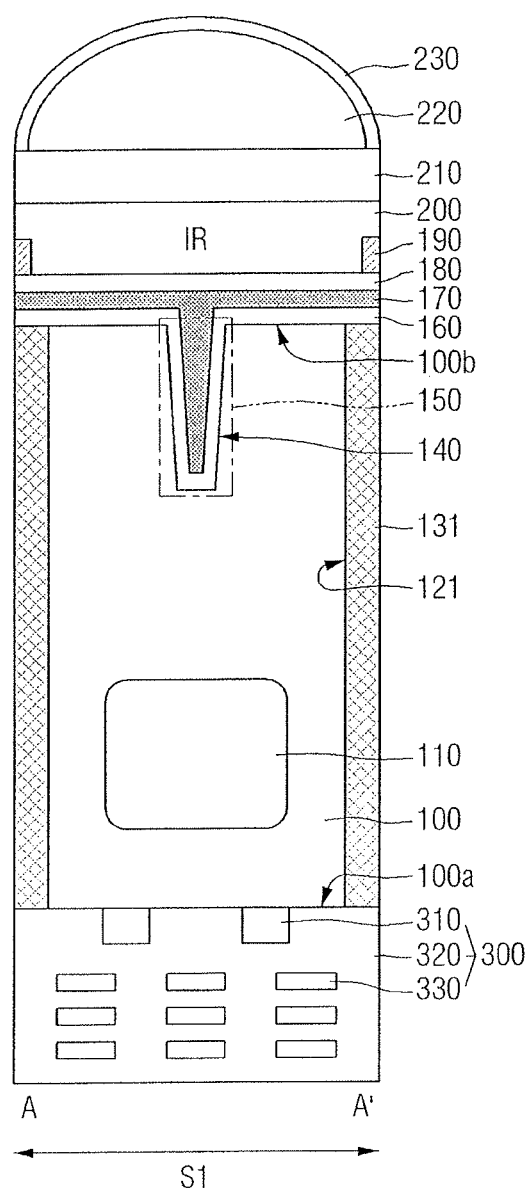
FIG. 10 illustrates a cross-sectional view provided to explain an image sensor according to some exemplary embodiments.

FIG. 10 is a cross-sectional view provided to explain an image sensor according to some exemplary embodiments. Referring to FIG. 10, the image sensor according to some exemplary embodiments includes the boundary isolation trench 121 and the boundary isolation film 131.

The boundary isolation trench 121 may connect the first surface 100*a* and the second surface 100*b* of the substrate 100. That is, the boundary isolation trench 121 may penetrate fully through the substrate 100. The boundary isolation trench 120 may completely surround a boundary of the first sensing region S1 in a vertical cross section as well as a horizontal cross section.

The boundary isolation trench 121 may be formed with a Frontside Deep Trench Isolation (FDTI) process. This will be explained in detail below.

The boundary isolation film 131 may entirely fill the boundary isolation trench 121. Accordingly, the boundary isolation film 131 may be exposed from the first surface 100*a* and the second surface 100*b* of the substrate 100. That is, the boundary isolation film 131 may include a first surface same as the first surface 100*a* of the substrate 100 and a second surface same as the second surface 100*b* of the substrate 100, e.g., be coplanar with both surface of the substrate 100.

The boundary isolation film 131 may extend longitudinally in a vertical direction compared to the inner reflection pattern film 150. Because the inner reflection pattern film 150 overlaps the first photoelectric device 110 in the vertical direction, it may not penetrate through the substrate 100 like the boundary isolation film 131. However, exemplary embodiments are not limited to the example given above.

Although it is illustrated that the boundary isolation trench 121 and the boundary isolation film 131 have a constant width in the drawing, it may not be limited hereto. The boundary isolation trench 121 and the boundary isolation film 131 may be formed in a tapered shape. That is, a width of the boundary isolation trench 121 may be gradually reduced in a direction from the second surface 100*b* toward the first surface 100*a*.

The boundary isolation film 131 may include a conductive material such as polysilicon, metal, and so on. In this case, the boundary isolation film 131 may secure a charge fixing function at an interface with the substrate 100 through a process of applying a negative voltage. Alternatively, a charge fixed region may be formed on the interface through a doping process.

That is, in the image sensor according to some exemplary embodiments, if the inner reflection pattern film 150 does not overlap the first photoelectric device 110 in the vertical direction, the inner reflection pattern film 150 may penetrate completely through the substrate 100 like the boundary isolation film 131.

Hereinbelow, an image sensor according to some exemplary embodiments will be described with reference to FIGS. 11 to 13. In the following description, description that overlaps the exemplary embodiments already provided above will not be described or described as brief as possible for the sake of brevity.

Figure 11:
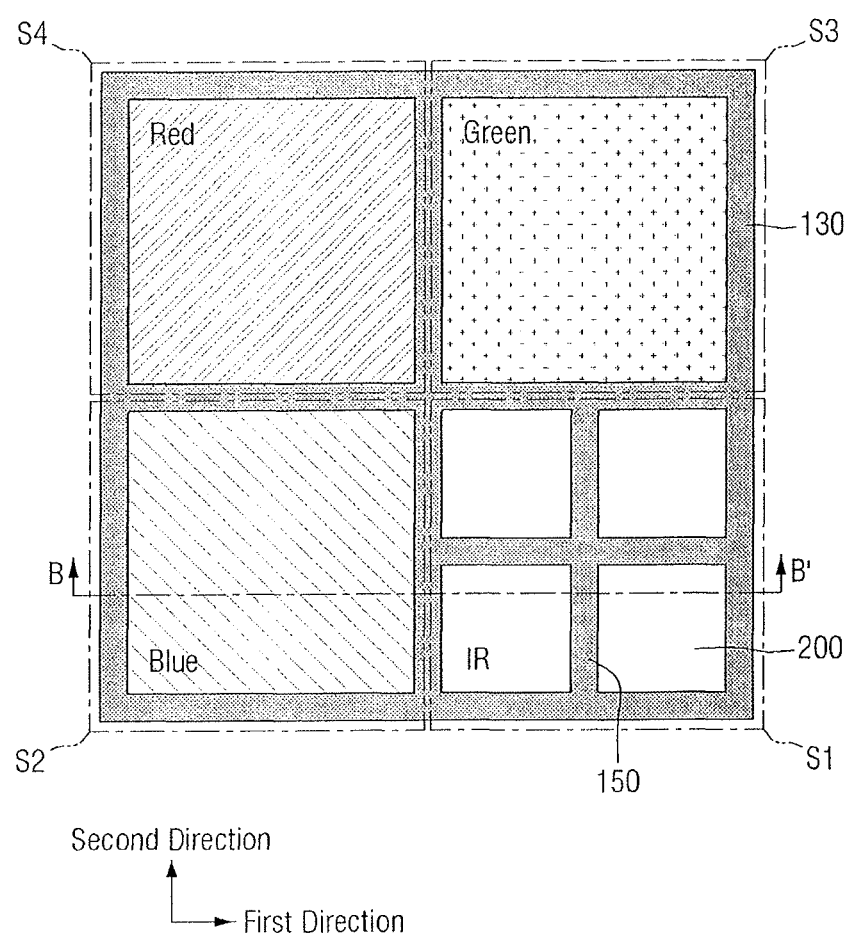
FIG. 11 illustrates a layout diagram provided to explain an image sensor according to some exemplary embodiments.
Figure 12:
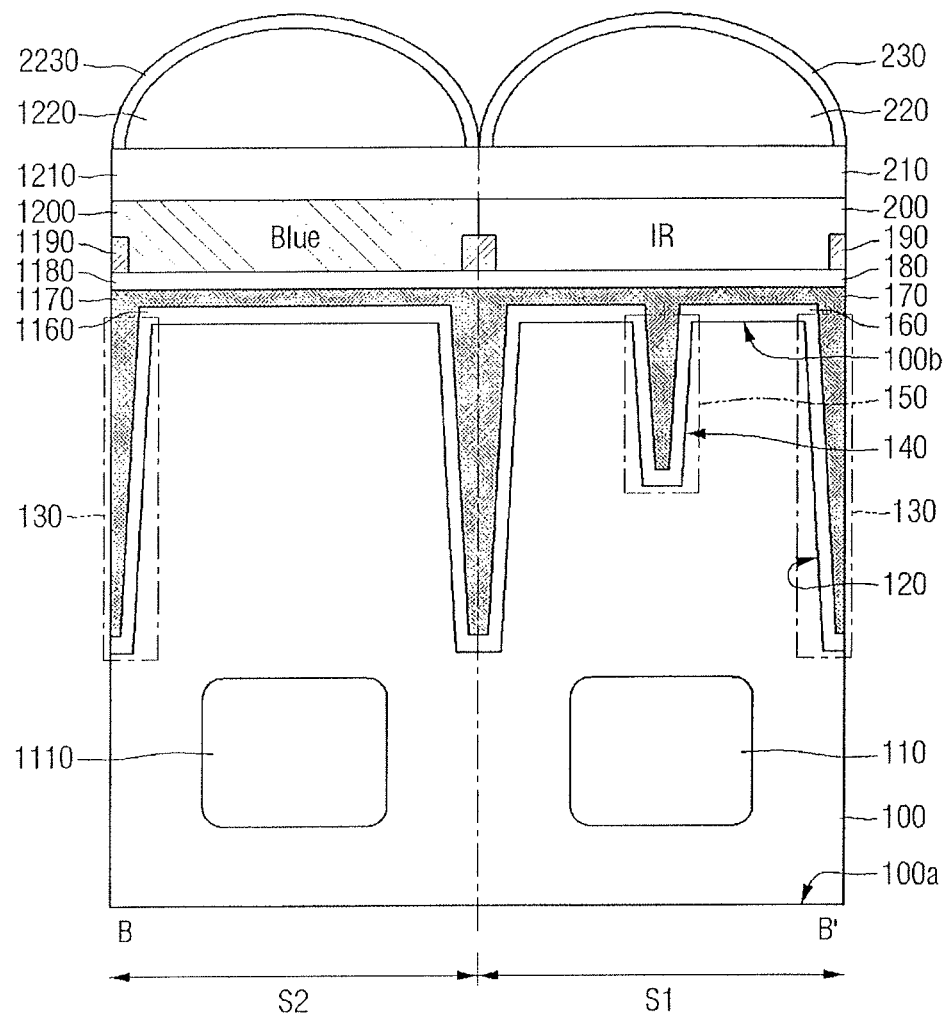
FIG. 12 illustrates a cross-sectional view taken on line B-B' of FIG. 11.

FIG. 11 is a layout diagram provided to explain an image sensor according to some exemplary embodiments, and FIG. 12 is a cross-sectional view taken on line B-B' of FIG. 11. FIG. 13 is a concept view provided to explain operation when light is incident on the image sensor shown in FIG. 12.

Figure 13:
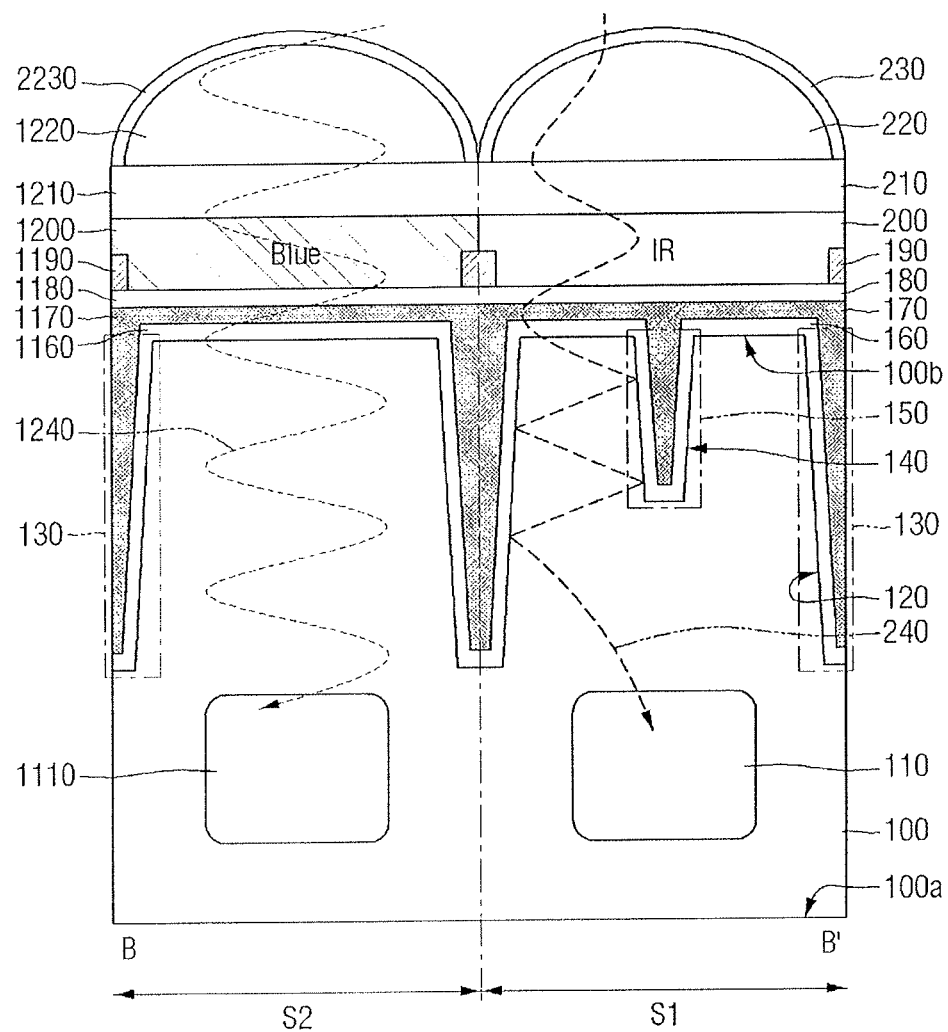
FIG. 13 illustrates a concept view provided to explain operation when infrared light is incident on the sensor shown in FIG. 12.

Referring to FIGS. 11 to 13, the image sensor according to some exemplary embodiments includes a second sensing region S2, a third sensing region S3, and a fourth sensing region S4, in addition to the first sensing region S1.

The first to fourth sensing regions S1-S4 may respectively have a rectangular horizontal cross section. The adjacent sensing regions of the first to fourth sensing regions S1-S4 may again form a greater rectangular horizontal cross section. Specifically, the second sensing region S2 and the third sensing region S3 may be positioned respectively on different sides of the first sensing region S1, and the fourth sensing region S4 may be positioned in a diagonal direction. In other words, the first and second sensing regions S1 and S2 may be in contact with third and fourth sensing regions S3 and S4, respectively, along a second direction, and the first and third sensing regions S1 and S3 may be in contact, respectively, with third and fourth sensing regions S3 and S4 along a first direction, intersecting the second direction. Both the first and second directions intersect a third direction, which is the direction in which light is incident on the image sensor.

The first to fourth sensing regions S1-S4 may be partitioned with the boundary isolation film 130. That is, the boundary isolation film 130 may be formed on a boundary of each of the first to fourth sensing regions S1-S4. Thus, the boundary isolation film 130 may have a largest rectangular outline, or a crisscross-shaped horizontal cross section in FIG. 11.

The second to fourth sensing regions S2-S4 may be sensing regions where the RGB filters are positioned respectively. That is, a blue color filter may be in the second sensing region S2, a green color filter may be in the third sensing region S3, and a red color filter may be in the fourth sensing region S4. However, this is merely one of exemplary embodiments. Accordingly, as long as the infrared filter 200 is positioned in the first sensing region S1 and the RGB color filters are positioned in the other regions, the position of each color filter may not be limited.

The inner reflection pattern film 150 may be present only in the first sensing region S1. The inner reflection pattern film 150 may reduce an effective silicon penetration distance only in the first sensing region S1 where the infrared filter 200 is present, and thus minimize QE damage.

Referring to FIG. 12, the second sensing region S2 may include a second photoelectric device 1110, a second fixed charge film 1160, a second anti-reflection film 1170, a second lower planarizing film 1180, a second side anti-reflection film 1190, a blue color filter 1200, a second upper planarizing film 1210, a second micro lens 1220, and a second protection film 2230.

The second photoelectric device 1110 may be within the substrate 100 in the second sensing region S2. The second fixed charge film 1160 is connected to the first fixed charge film 160 and reduces the EHP generated thermally in the second surface 100b of the substrate 100, thus reducing dark current.

The second anti-reflection film 1170 is connected to the first anti-reflection film 170 and has a different refractive index from the second fixed charge film 1160, so that the second anti-reflection film 1170 may reduce or prevent reflection of the external incident light. The second lower planarizing film 1180 may be connected to the first lower planarizing film 180 to prevent the substrate 100 from being damaged in a patterning process.

The blue color filter 1200 may filter out wavelengths other than the blue color region of the visible light in the incident light. The light passed through the blue color filter 1200 may pass through the lower structures and reach the second photoelectric device 1110.

The second side anti-reflection film 1190 may be connected to a portion of the first side anti-reflection film 190. The second side anti-reflection film 1190 may prevent the incident light passing through the blue color filter 1200 from reflecting or scattering to the side surface.

The second upper planarizing film 1210 may be connected to the first upper planarizing film 210 to planarize height variations occurred due to underlying structures. In an example, the planarizing film may be present only on a lower surface of the blue color filter 1200, or only on an upper surface of the blue color filter 1200. Alternatively, the planarizing film may be absent on both of an upper surface and a lower surface of the blue color filter 1200.

The second micro lens 1220 may be formed on the second upper planarizing film 1210. As illustrated, the second micro lens 1220 may have a convex upward shape. The second protection film 2230 may be formed with a certain thickness along a surface of the second micro lens 1220. Together with the first protection film 230, the second protection film 2230 may fill between the first micro lens 220 and the second micro lens 1220. As a result, the incident light concentrating capability may be enhanced.

Referring to FIG. 13, the first sensing region S1 has a shortened effective silicon penetration distance due to the inner reflection pattern film 150 so that the incident infrared light 240 may reach the first photoelectric device 110. In the second sensing region S2, the incident light 1240 passed through the blue color filter 1200 may reach the second photoelectric device 1110 with a regular, e.g., non-shortened, length.

The image sensor according to some exemplary embodiments can maximize photoelectric efficiency with the substrate 100 having a same depth with respect to the light of different wavelengths and effective silicon penetration distances.

Hereinbelow, an image sensor according to some exemplary embodiments will be described with reference to FIG. 14. In the following description, description that overlaps the exemplary embodiments already provided above will not be described or described as brief as possible for the sake of brevity.

Figure 14:
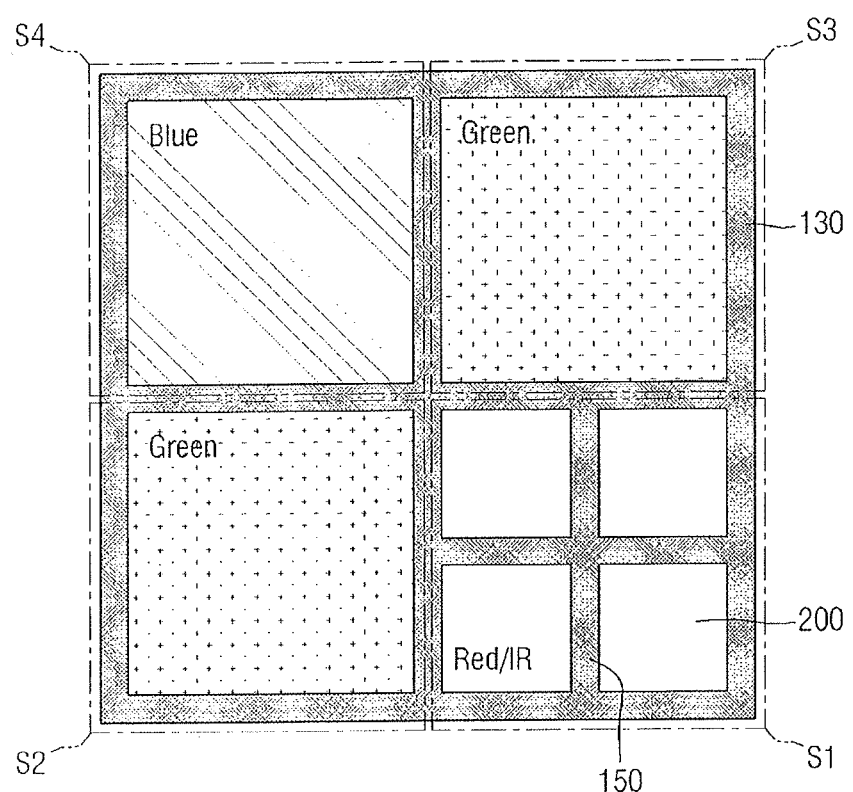
FIG. 14 illustrates a layout diagram provided to explain an image sensor according to some exemplary embodiments.

FIG. 14 is a layout diagram provided to explain an image sensor according to some exemplary embodiments. Referring to FIG. 14, in the image sensor according to some exemplary embodiments, the infrared filter 200 may perform a role of both the infrared light filter and the red color filter in the first sensing region S1.

In the RGB filter having no infrared filter 200, a green color filter may be the most needed filter. Accordingly, the green color filter next to the blue color filter and the green color filter next to the red color filter (red/IR) may be disposed in the third sensing region S3 and the second sensing region S2, respectively. Since the red color filter and the infrared filter 200 may be the adjacent wavelength regions to each other, the Red/IR filter for filtering the two wavelength regions simultaneously may be disposed in the first sensing region S1. As a result, an area of the most-necessary region, i.e., the green color filter region, is increased, and the QE damage may be reduced or minimized, as in the red color filter and the infrared filter.

Hereinbelow, an image sensor according to some exemplary embodiments will be described with reference to FIGS. 15 and 16. In the following description, description overlapped with the exemplary embodiments already provided above will not be described or described as brief as possible for the sake of brevity.

Figure 15:
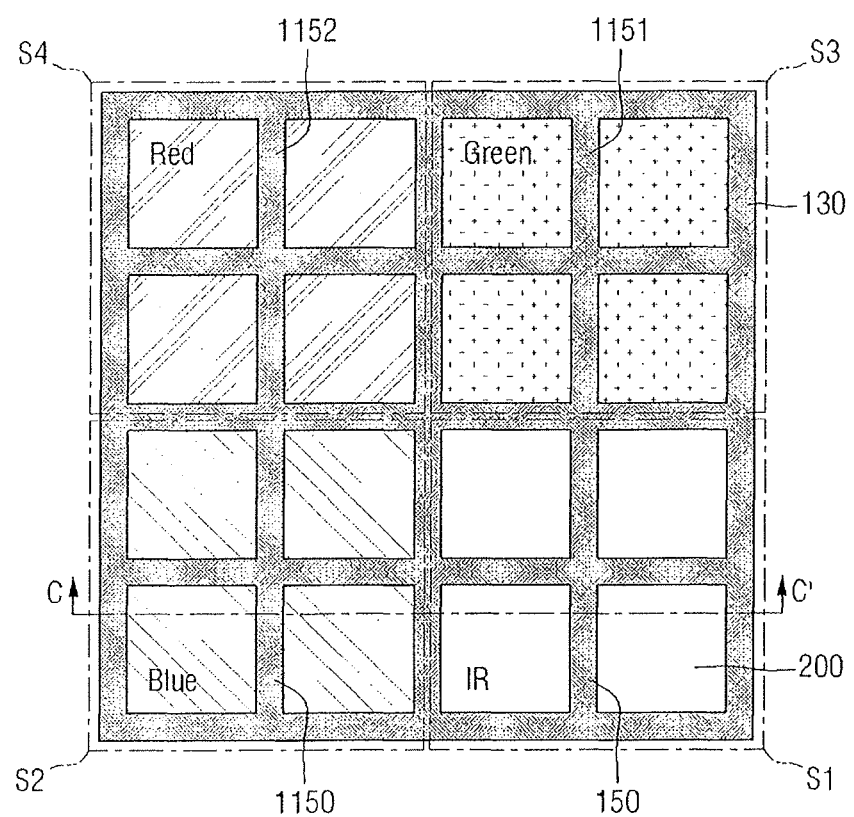
FIG. 15 illustrates a layout diagram provided to explain an image sensor according to some exemplary embodiments.

FIG. 15 is a layout diagram provided to explain an image sensor according to some exemplary embodiments. FIG. 16 is a cross-sectional view taken on line C-C' of FIG. 15.

Figure 16:
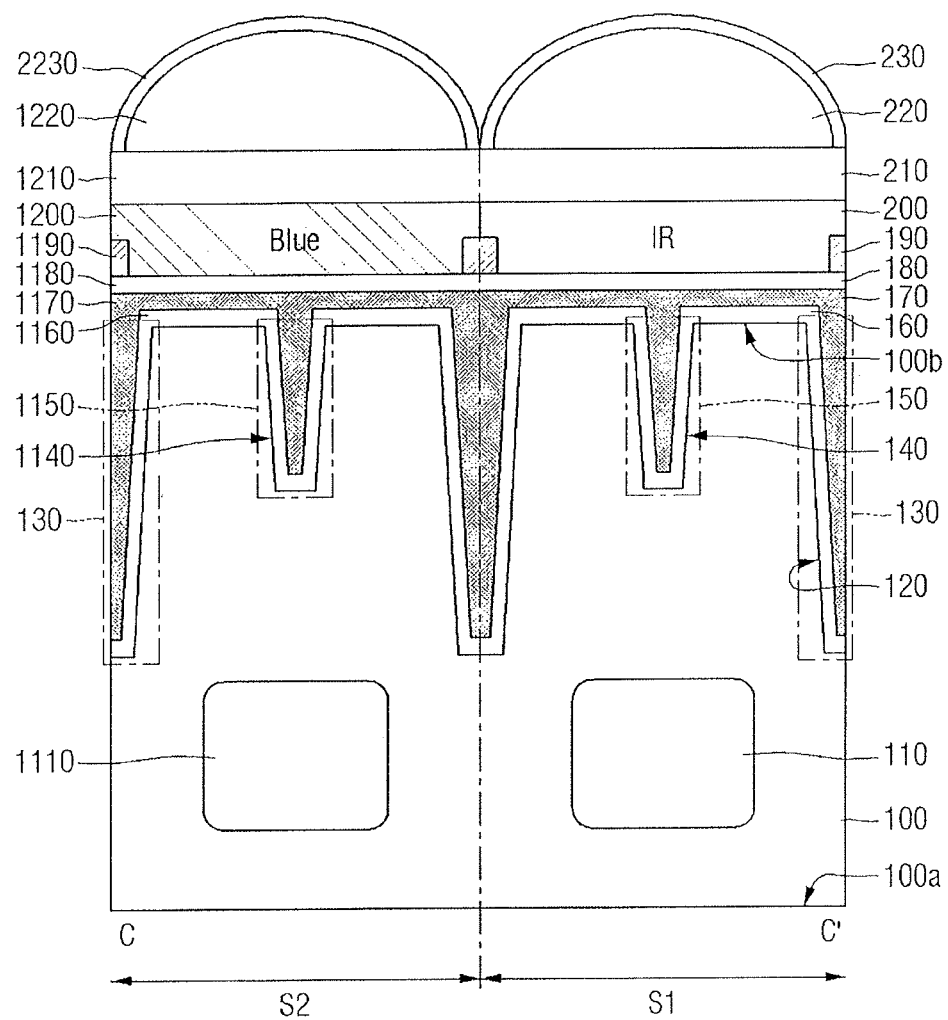
FIG. 16 illustrates a cross-sectional view taken on line C-C' of FIG. 15.

Referring to FIGS. 15 and 16, in the image sensor according to some exemplary embodiments, the inner reflection pattern film 150 may be formed in the first sensing region S1, and the first to third sub-boundary isolation films 1150, 1151, 1152 may be formed in the second to fourth sensing regions S2-S4, respectively. Specifically, the first sub-boundary isolation film 1150 may be formed in the second sensing region S2, the second sub-boundary isolation film 1151 may be formed in the third sensing region S3, and the third sub-boundary isolation film 1152 may be formed in the fourth sensing region S4.

The first to third sub-boundary isolation films 1150, 1151, 1152 may be in contact with the boundary isolation film 130. The first to third sub-boundary isolation films 1150, 1151, 1152 may isolate the second to fourth sensing regions S2-S4 into a crisscross shape. However, exemplary embodiments are not limited to the example given above, and the regions may be halved vertically according to some exemplary embodiments.

The first to third sub-boundary isolation films 1150, 1151, 1152 may be formed for an auto focusing function in the RGB color filter. That is, for the auto focusing function of quickly capturing a focal distance by using a distance between two images in the right and the left on one pixel, the first to third sub-boundary isolation films 1150, 1151, 1152 may partition one pixel, i.e., one sensing region, into a plurality of pixels.

Referring to FIG. 16, the sub-boundary isolation trench 1140 may be formed by etching in a depth direction into the substrate 100. The sub-boundary isolation trench 1140 may be formed on the second side 100*b* of the substrate 100, and may extend in a direction toward the first side 100*a*. The sub-boundary isolation trench 1140 may not reach the second side 100*b* of the substrate 100.

In an example, a depth of the sub-boundary isolation trench 1140 may be less than a depth at which the first photoelectric device 110 is positioned. This is to prevent damage of the second photoelectric device 1110 during formation of the sub-boundary isolation trench 1140. A depth of the sub-boundary isolation trench 1140 may be deeper or shallower than a depth of the inner reflection pattern trench 140.

The first sub-boundary isolation film 1150 may be filled with the second fixed charge film 1160 and the second anti-reflection film 1170. Likewise, the second and third sub-boundary isolation films 1151, 1152 may be filled with a stack structure of the fixed charge film and the anti-reflection film.

Hereinbelow, an image sensor according to some exemplary embodiments will be described with reference to FIG. 17. In the following description, description that overlaps the exemplary embodiments already provided above will not be described or described as brief as possible for the sake of brevity.

Figure 17:
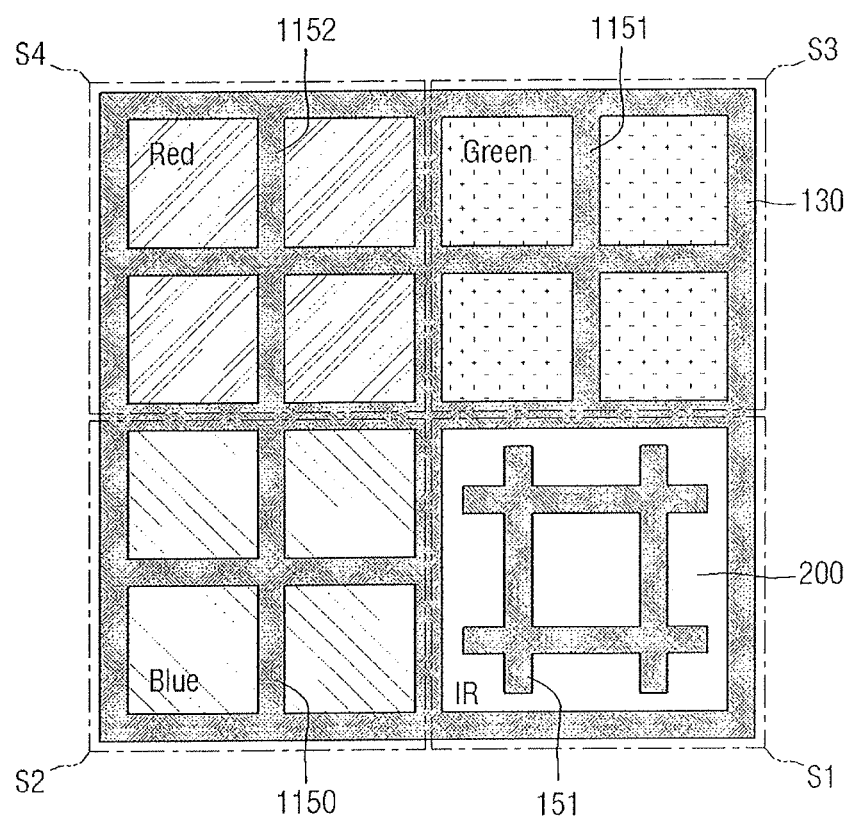
FIG. 17 illustrates a layout diagram provided to explain an image sensor according to some exemplary embodiments.

FIG. 17 is a layout diagram provided to explain an image sensor according to some exemplary embodiments. Referring to FIG. 17, the image sensor according to some exemplary embodiments may include the inner reflection pattern film 151 in the first sensing region S1, and include the first to third sub-boundary isolation films 1150, 1151, 1152 in the second to fourth sensing regions S2-S4.

The first to third sub-boundary isolation films 1150, 1151, 1152 may be in contact with the boundary isolation film 130 to partition the second to fourth sensing regions S2-S4 into a plurality of regions. Alternatively, the inner reflection pattern film 151 may not be in contact with the boundary isolation film 130 within the substrate 100 and may not partition the first sensing region S1. (Of course, the anti-reflection film and the fixed charge film may be connected to each other above the substrate 100, but the expression 'not in contact' as used herein means that each of the trenches do not contact within the substrate 100.) The inner reflection pattern film 151 may be also in contact with the boundary isolation film 130 (within the substrate 100), and may partition the first sensing region S1.

This contact arises due to different functions of the first to third sub-boundary isolation films 1150, 1151 1152 and the inner reflection pattern film 151. The first to third sub-boundary isolation films 1150, 1151, 1152 may partition the sensing regions for the purpose of auto focusing, but the inner reflection pattern film 151 may simply reflect the incident infrared light so as to minimize the QE damage. Accordingly, a degree of freedom with respect to a shape of the inner reflection pattern film 151 may be higher than a degree of freedom with respect to shapes of the first to third sub-boundary isolation films 1150, 1151, 1152.

Hereinbelow, a method for fabricating an image sensor according to some exemplary embodiments will be explained with reference to FIGS. 12 and 18 to 24. In the following description, description that overlaps the exemplary embodiments already provided above will not be described or described as brief as possible for the sake of brevity. FIGS. 18 to 24 are views illustrating intermediate stages of fabrication, provided to explain a method for fabricating an image sensor according to some exemplary embodiments.

Figure 18:
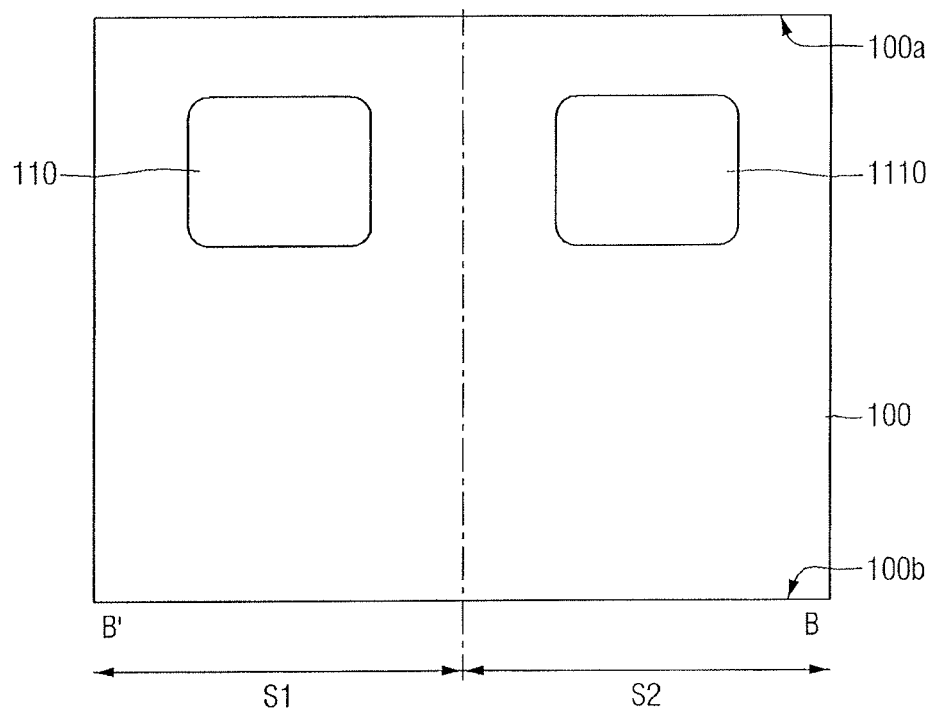
FIGS. 18 to 24 illustrate views of stages in a method for fabricating an image sensor according to some exemplary embodiments.

Referring first to FIG. 18, the substrate 100 is provided. The substrate 100 may include the first surface 100*a* and the second surface 100*b* opposite each other. The first surface 100*a* of the substrate 100 may be a front side, and the second surface 100*b* of the substrate 100 may be a back side. The substrate 100 may include the first photoelectric device 110 and the second photoelectric device 1110 therein. The first photoelectric device 110 may be positioned in the first sensing region S1 of the substrate 100, and the second photoelectric device 1110 may be positioned in the second sensing region S2.

Figure 19:
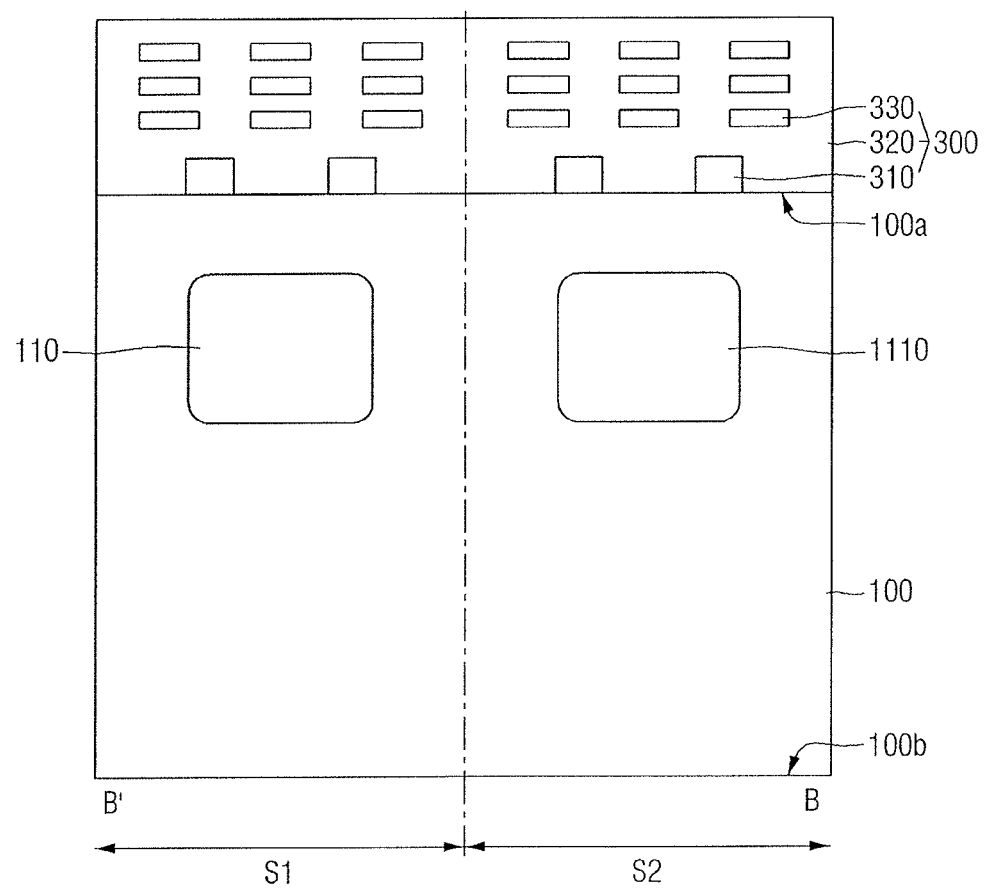

Next, referring to FIG. 19, the insulating structure 300 is formed on the first surface 100*a*. The insulating structure 300 may be formed on the first side 100*a* of the substrate 100. That is, the insulating structure 300 may be formed on the front side of the substrate 100. The insulating structure 300 may include an insulating film 320, a gate structure 310, and a wire structure 330.

The insulating film 320 may overlie and surround the gate structure 310 and the wire structure 330 which will be described below. That is, the insulating film 320 may serve to insulate between the gate structure 310 and the wire structure 330.

The insulating structure 300 may be on the first side 100a of the substrate 100. As illustrated in FIG. 2, the gate structure 310 may be, e.g., a gate of the charge transfer transistor 15, a gate of the reset transistor 18, a gate of the select transistor 19 a gate of the drive transistor 17, and so on. The wire structure 330 may be formed in the first region S and include a plurality of sequentially stacked wires.

Figure 20:
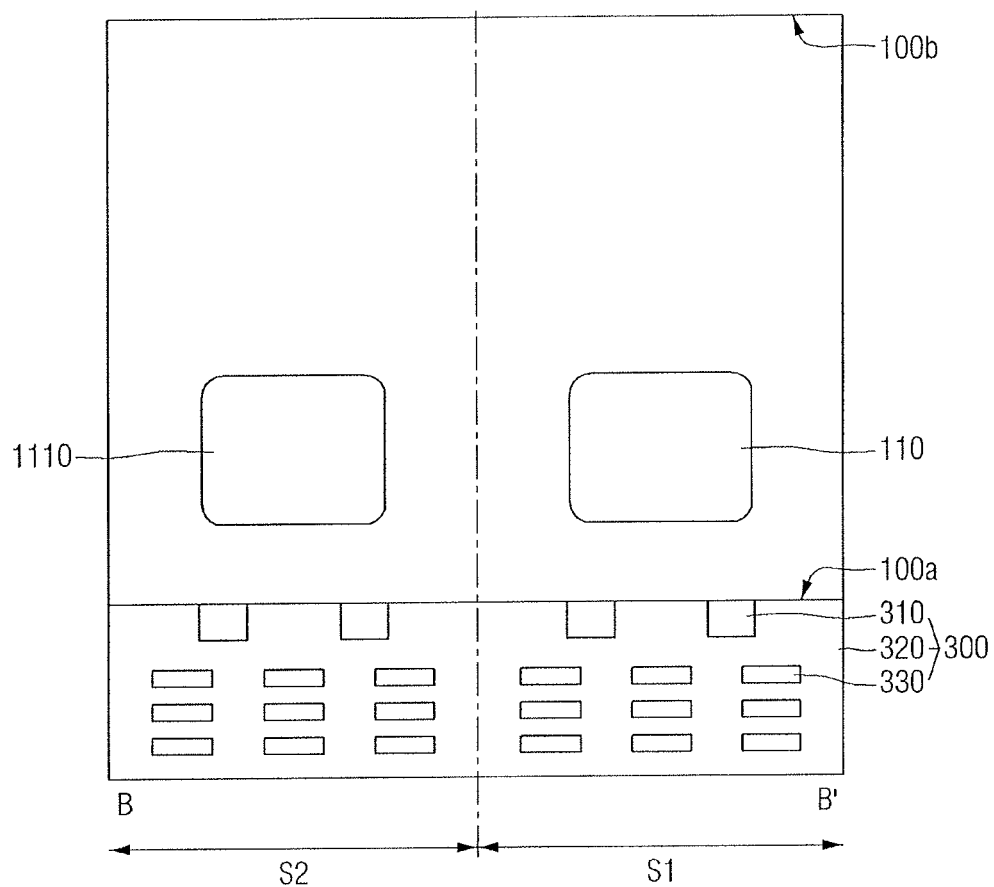

Next, referring to FIG. 20, the substrate 100 is flipped or inverted so that the second surface 100b faces upward. Accordingly, with respect to current state of the substrate 100, the first side 100a may be a lower surface and the second surface 100b may be an upper surface. Accordingly, the insulating structure 300 may be positioned under the substrate 100.

Figure 21:
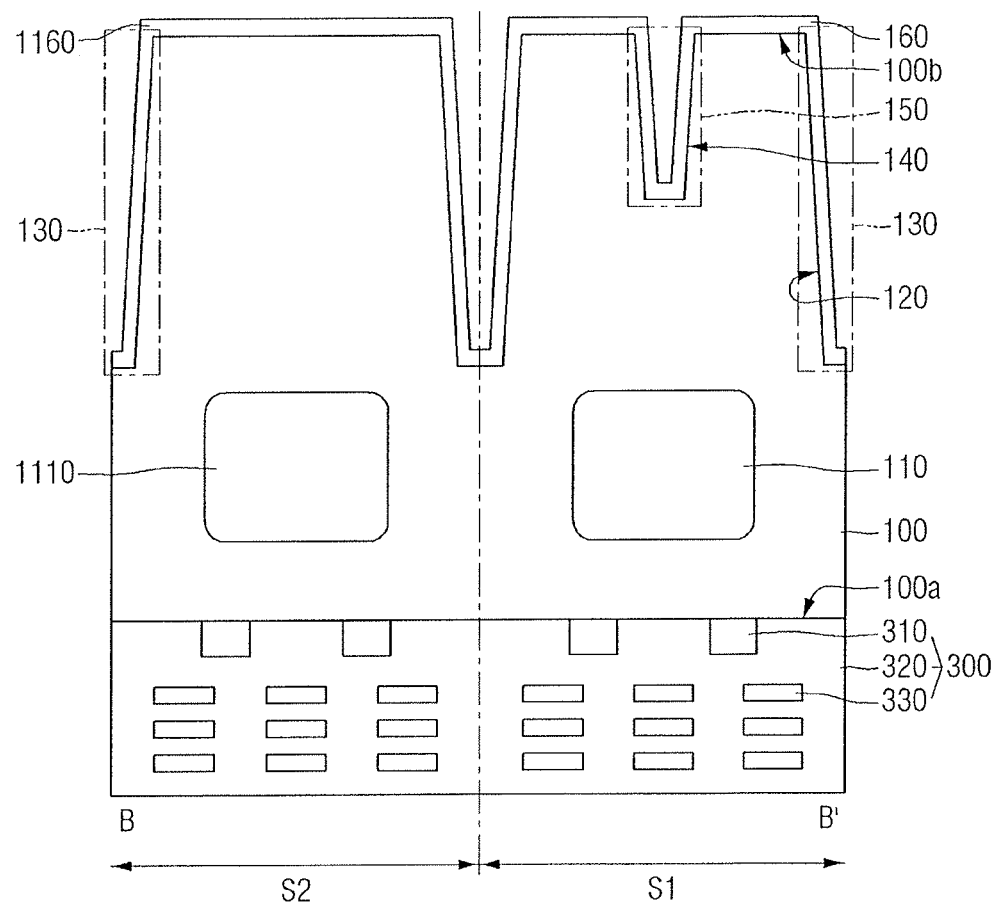

Next, referring to FIG. 21, a first fixed charge film 160 and a second fixed charge film 1160 may be formed on the boundary isolation trench 120 and the inner reflection pattern trench 140. The first fixed charge film 160 may be formed along the second surface 100b of the substrate 100 and surfaces of the boundary isolation trench 120 and the inner reflection pattern trench 140. The first fixed charge film 160 may fill only a portion of the boundary isolation trench 120 and the inner reflection pattern trench 140. In an example, the inner reflection pattern film 150 is formed in the first sensing region S1, but there is no film within the sensing region that is formed in the second sensing region S2.

Figure 22:
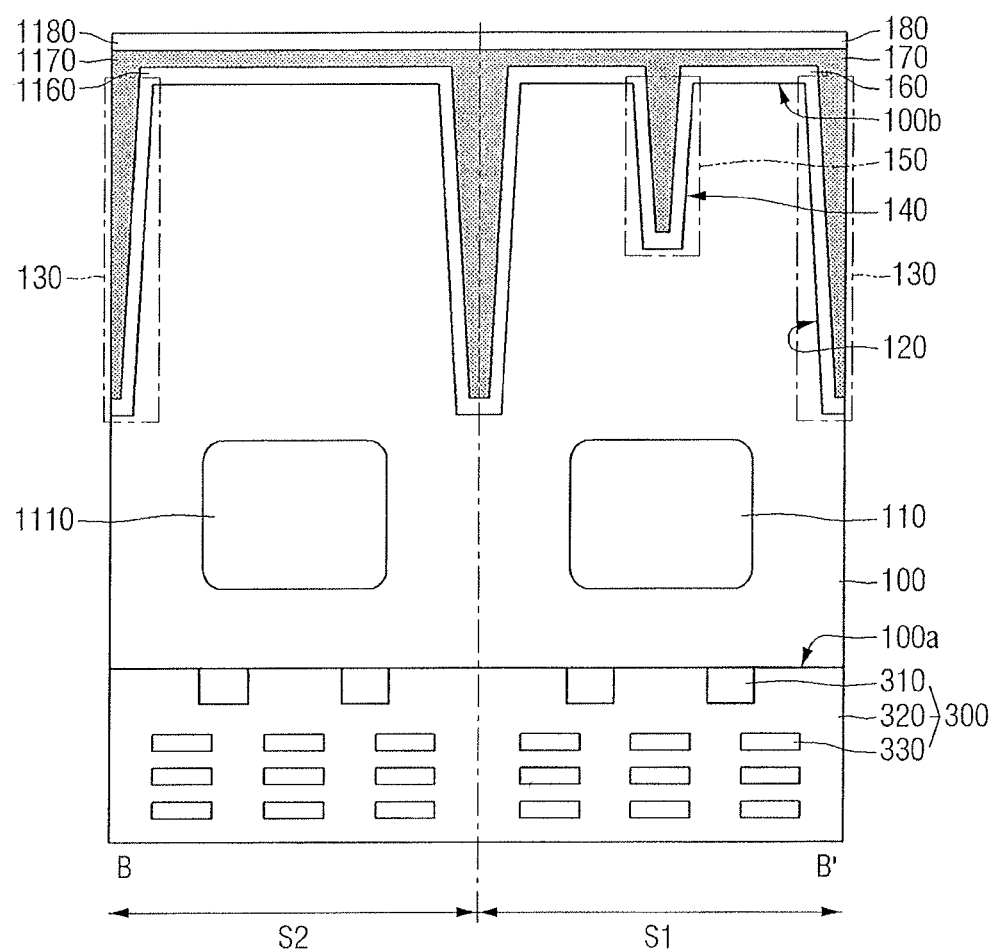

Next, referring to FIG. 22, the first anti-reflection film 170 and the second anti-reflection film 1170 are formed. The first anti-reflection film 170 and the second anti-reflection film 1170 may be formed on the first fixed charge film 160 and the second fixed charge film 1160, respectively. The first anti-reflection film 170 and the second anti-reflection film 1170 may reduce or prevent reflection of the external incident light.

Next, the first lower planarizing film 180 and the second lower planarizing film 1180 are formed. The first lower planarizing film 180 and the second lower planarizing film 1180 may include, for example, at least one of a silicon oxide film-based material, a silicon nitride film-based material, resin, or a combination thereof.

Figure 23:
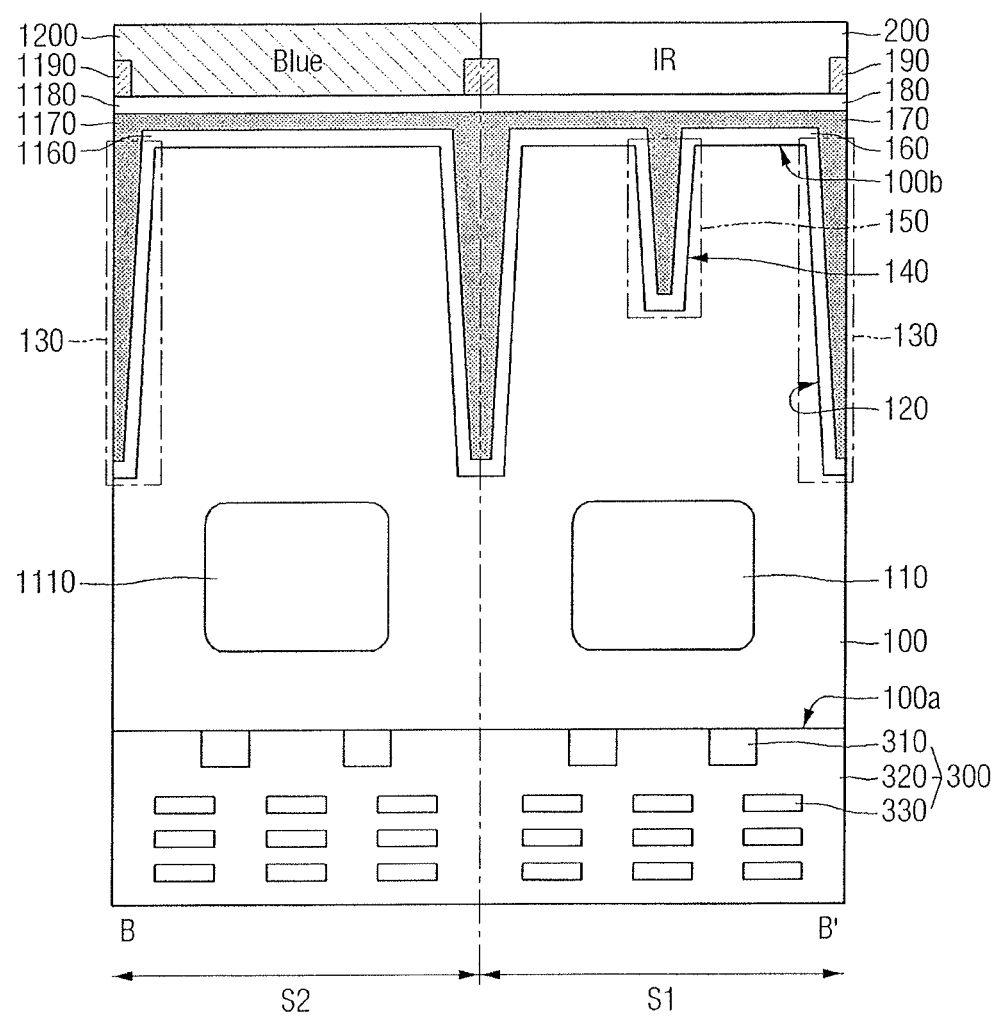

Next, referring to FIG. 23, the infrared filter 200, the blue color filter 1200, the first side anti-reflection film 190 and the second side anti-reflection film 1190 are formed. The infrared filter 200 may filter out wavelengths other than infrared light in the incident light. The blue color filter 1200 may filter out wavelengths except for the blue color region of the visible light in the incident light.

The first side anti-reflection film 190 and the second side anti-reflection film 1190 may cover a portion of the infrared filter 200 and the blue color filter 1200 from a lateral surface of the infrared filter 200 and the blue color filter 1200, respectively. The first side anti-reflection film 190 and the second side anti-reflection film 1190 may include, for example, tungsten (W).

Figure 24:
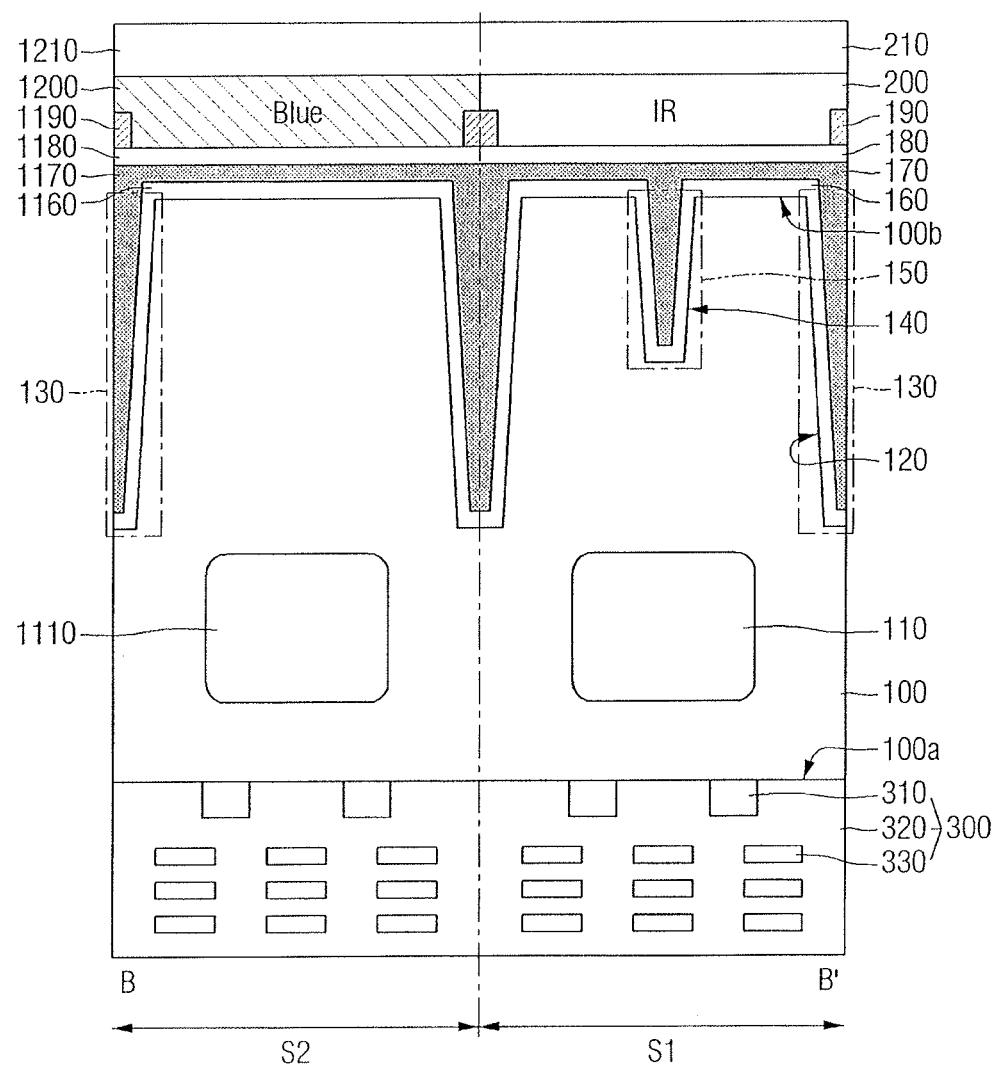

Next, referring to FIG. 24, the first upper planarizing film 210 and the second upper planarizing film 1210 are formed. The first upper planarizing film 210 may be formed on the infrared filter 200. The second upper planarizing film 1210 may be formed flat on the blue color filter 1200. The second upper planarizing film 1210 and the second upper planarizing film 1210 may include, e.g., at least one of a silicon oxide film-based material, a silicon nitride film-based material, resin or a combination thereof.

Next, referring to FIG. 12, a first micro lens 220 and a second micro lens 1220 are formed. In an example, although FIG. 12 does not specifically illustrate an insulating structure 300, it is assumed herein that the insulating structure 300 of FIG. 11 is provided.

The first micro lens 220 and the second micro lens 1220 may be formed of an organic material such as photoresist PR. Formation of the first micro lens 220 and the second micro lens 1220 with an organic material may involve, for example, formation of the first micro lens 220 and the second micro lens 1220 by forming an organic material pattern on the first upper planarizing film 210 and the second upper planarizing film 1210 and performing annealing process. The annealing process may cause the organic material pattern to be changed into a form of the first micro lens 220 and the second micro lens 1220.

Next, the first protection film 230 and the second protection film 2230 may be formed on the first micro lens 220 and the second micro lens 1220, respectively. In this case, the first protection film 230 and the second protection film 2230 may be an inorganic oxide film.

Hereinbelow, a method for fabricating an image sensor according to some exemplary embodiments will be explained with reference to FIGS. 18 and 25 to 28. In the following description, description that overlaps the exemplary embodiments already provided above will not be described or described as brief as possible for the sake of brevity.

FIGS. 25 to 28 are views illustrating stages in method for fabricating an image sensor according to some exemplary embodiments. The description about the embodiment of FIG. 18, which may be identical, may not be redundantly explained below.

Figure 25:
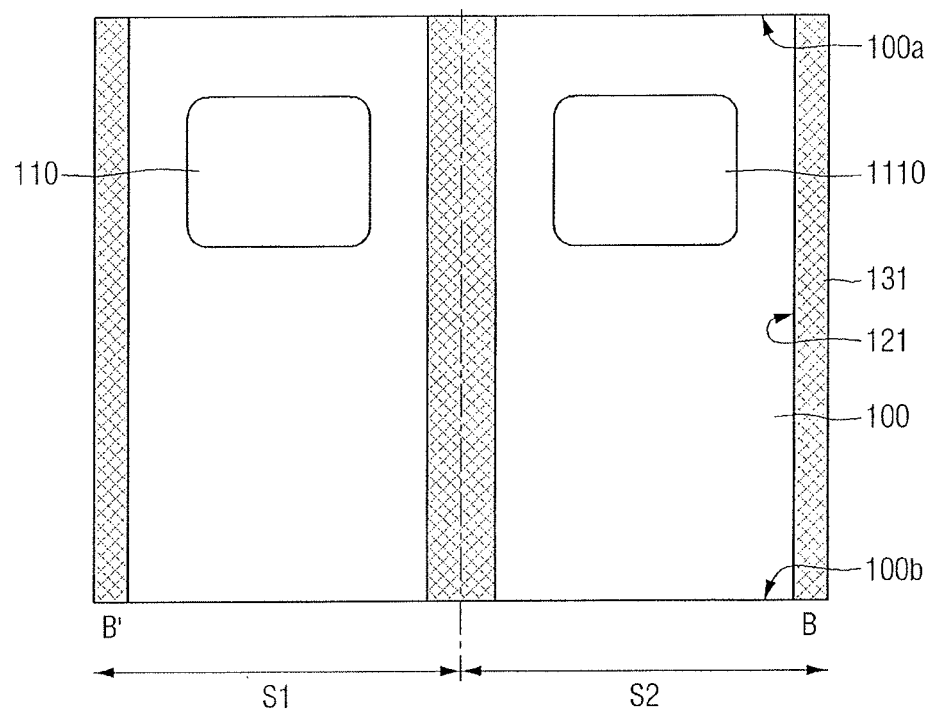
FIGS. 25 to 28 illustrate views of stages in a method for fabricating an image sensor according to some exemplary embodiments.

Next, referring to FIG. 25, the boundary isolation film 131 is formed. The boundary isolation film 131 may be formed on the first surface 100a with the FDTI process. The boundary isolation trench 121 may penetrate through the first surface 100a and the second surface 100b.

The boundary isolation film 131 may entirely fill the boundary isolation trench 121. Accordingly, the boundary isolation film 131 may be exposed from the first side 100a and the second side 100b of the substrate 100. That is, the boundary isolation film 131 may include a first side same as the first side 100a of the substrate 100 and a second side same as the second side 100b of the substrate 100.

The boundary isolation film 131 may be filled with polysilicon or a metal. The boundary isolation film 131 may allow charge to be fixed on the interface of the substrate 100 and the boundary isolation film 131 through a process of applying a negative voltage.

Alternatively, a region fixed with charge may be formed by performing a doping process on sidewalls of the boundary isolation trench 121 before formation of the boundary isolation film 131. Through the methods described above, the substrate 100 and the boundary isolation film 131 may have different conductive types from each other, which may reduce the EHP generated thermally and reduce dark current.

Figure 26:
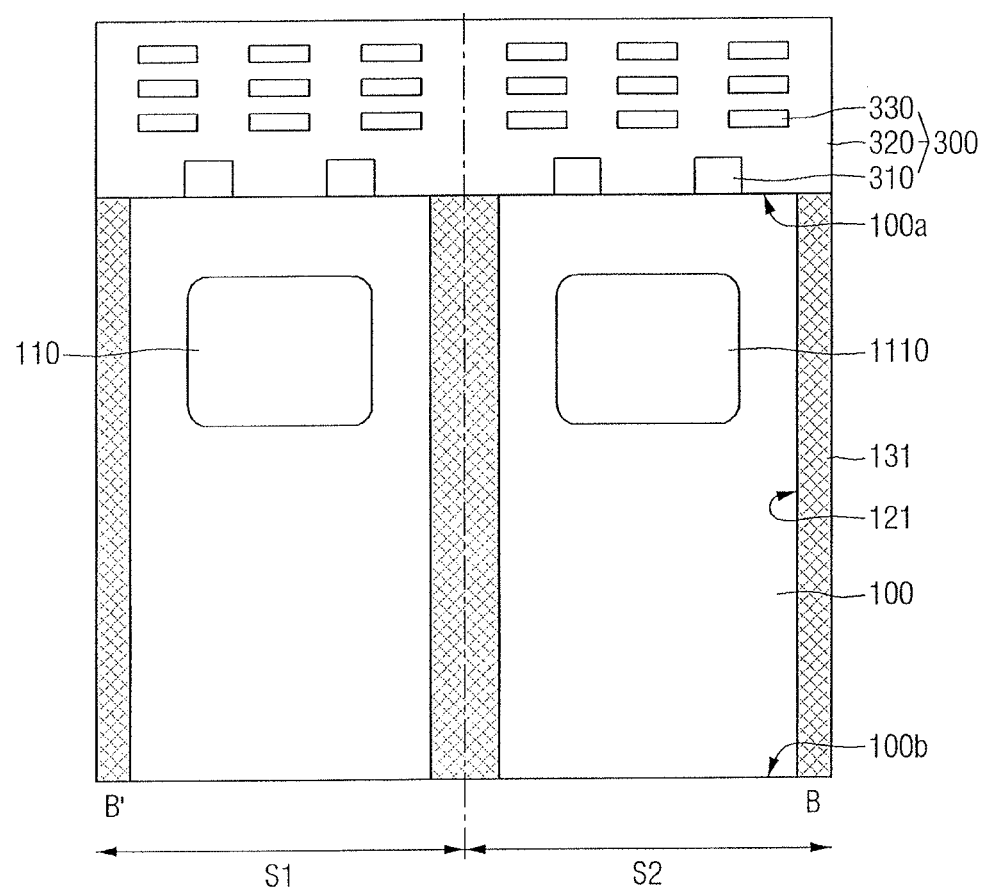

Next, referring to FIG. 26, the insulating structure 300 is formed on the first side 100a. The insulating structure 300 may be formed on the first surface 100a of the substrate 100 and the boundary isolation film 131. That is, the insulating structure 300 may be formed on the front side of the substrate 100. The insulating structure 300 may include an insulating film 320, a gate structure 310, and a wire structure 330.

Figure 27:
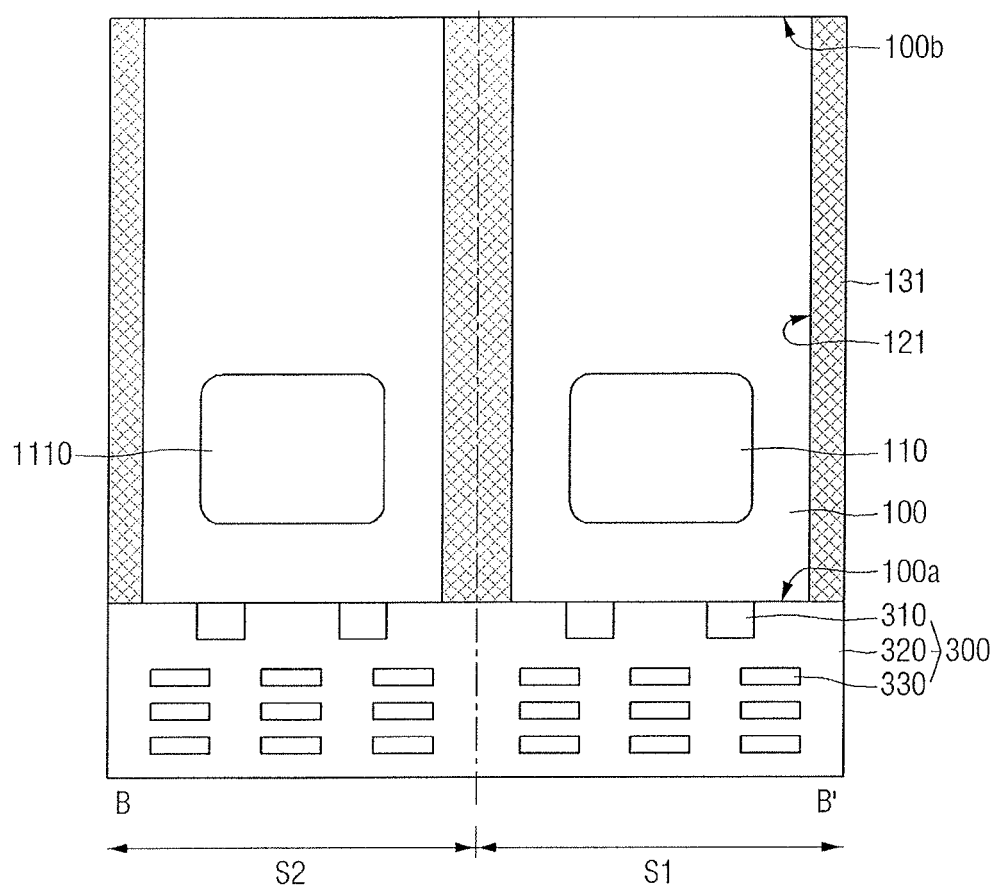

Next, referring to FIG. 27, the substrate 100 is inverted so that the second side 100b is faced upward. Accordingly, with respect to current state of the substrate 100, the first surface 100a may be a lower surface and the second surface 100b may be an upper surface. Accordingly, the insulating structure 300 may be positioned under the substrate 100 in the image sensor.

Figure 28:
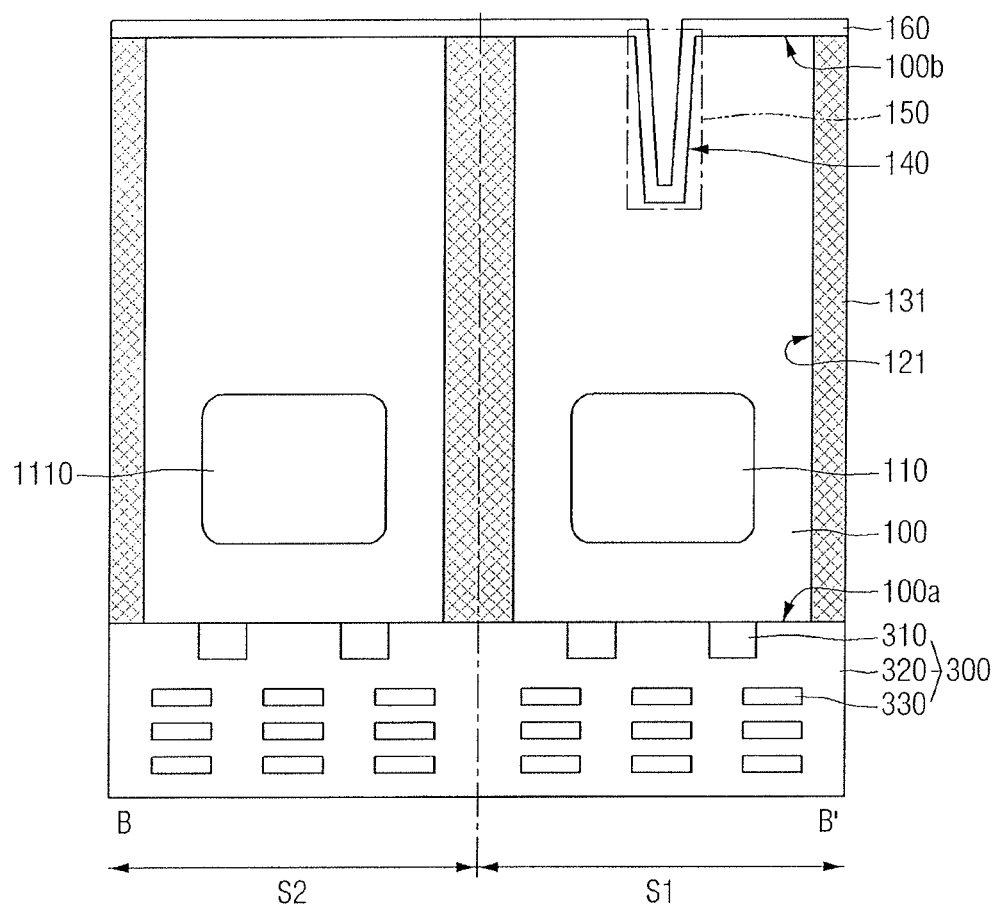

Next, referring to FIG. 28, the first fixed charge film 160 is formed on the second side 100b of the second sensing region S2 and a surface of the inner reflection pattern trench 140.

Next, referring to FIGS. 10 and 22 to 24, an upper structure is further formed. FIG. 10 is a view illustrating a first sensing region S1 including the boundary isolation film 131, and FIGS. 22 to 24 are views illustrating that an upper structure is formed uniformly except that the boundary isolation film 130 is included instead of the boundary isolation film 131.

Accordingly, in the first sensing region S1, the first anti-reflection film 170, the first lower planarizing film 180, the infrared filter 200, the first side anti-reflection film 190, the first upper planarizing film 210, the first micro lens 220, and the first protection film 230 may be formed in the first fixed charge film 160.

Likewise, in the second sensing region S2, the second anti-reflection film 1170, the second lower planarizing film 1180, the blue color filter 1200, the second side anti-reflection film 1190, the second upper planarizing film 1210, the second micro lens 1220, and the second protection film 2230 may be formed in the second fixed charge film 1160.

By way of summation and review, one or more embodiments provide an image sensor with improved operating characteristics and method for fabricating the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor comprising:
a first sensing region having a color filter;
a second sensing region;
a side anti-reflection film between the first sensing region and the second sensing region;
a boundary isolation trench having a first length from a top surface of a substrate and disposed between the first sensing region and the second sensing region;
a boundary isolation film filling the boundary isolation trench;
a first inner reflection pattern film having a second length from the top surface of the substrate and disposed between a first boundary of the second sensing region and a second boundary of the second sensing region; and
a planarizing film on the top surface of the substrate, wherein the second length is shorter than the first length, wherein the planarizing film includes a silicon nitride, and wherein the color filter is disposed on the planarizing film, and a bottom surface of the color filter is coplanar with a bottom surface of the side anti-reflection film.

2. The image sensor of claim 1, wherein the color filter is a green color filter.

3. The image sensor of claim 1, wherein the color filter is a blue color filter.

4. The image sensor of claim 1, wherein the boundary isolation film includes hafnium oxide.

5. The image sensor of claim 1, wherein the boundary isolation film includes aluminum oxide.

6. The image sensor of claim 5, wherein the boundary isolation trench does not connect the top surface and a bottom surface of the substrate.

7. The image sensor of claim 5, wherein the boundary isolation trench connects the top surface and a bottom surface of the substrate.

8. The image sensor of claim 1, wherein the side anti-reflection film includes tungsten.

9. The image sensor of claim 1, further comprising a second inner reflection pattern film between a first boundary of the first sensing region and a second boundary of the first sensing region.

10. The image sensor of claim 9, wherein the boundary isolation trench does not connect the top surface and a bottom surface of the substrate.

11. The image sensor of claim 9, wherein the boundary isolation trench connects the top surface and a bottom surface of the substrate.

12. An image sensor, comprising
a first sensing region having a color filter;
a second sensing region;
a side anti-reflection film between the first sensing region and the second sensing region;
a boundary isolation trench having a first length from a top surface of a substrate and disposed between the first sensing region and the second sensing region;
a boundary isolation film filling the boundary isolation trench;
an inner reflection pattern film having a second length from the top surface of the substrate and disposed between a first boundary of the second sensing region and a second boundary of the second sensing region; and
a first planarizing film on the top surface of the substrate, wherein the second length is shorter than the first length, wherein the inner reflection pattern film includes a hafnium oxide, and
wherein the color filter is disposed on the first planarizing film, and a bottom surface of the color filter is coplanar with a bottom surface of the side anti-reflection film.

13. The image sensor of claim 12, further comprising a second planarizing film on the first planarizing film.

14. The image sensor of claim 12, wherein the boundary isolation trench does not connect the top surface and a bottom surface of the substrate.

15. The image sensor of claim 12, wherein the boundary isolation trench connects the top surface and a bottom surface of the substrate.

16. The image sensor of claim 13, further comprising a micro-lens on the second planarizing film and a protection film on the micro-lens.

17. The image sensor of claim 16, wherein the protection film is a silicon oxide film.

18. The image sensor of claim 12, wherein the color filter is a green color filter.

19. The image sensor of claim 12, wherein the color filter is a blue color filter.

* * * * *